US012677490B2

(12) United States Patent
Miki

(10) Patent No.: US 12,677,490 B2
(45) Date of Patent: Jul. 7, 2026

(54) PHOTOELECTRIC CONVERSION DEVICE

(71) Applicant: CANON KABUSHIKI KAISHA,
Tokyo (JP)

(72) Inventor: Takafumi Miki, Kanagawa (JP)

(73) Assignee: Canon Kabushiki Kaisha, Tokyo (JP)

( * ) Notice: Subject to any disclaimer, the term of this
patent is extended or adjusted under 35
U.S.C. 154(b) by 377 days.

(21) Appl. No.: 18/338,115

(22) Filed: Jun. 20, 2023

(65) Prior Publication Data

US 2023/0420468 A1 Dec. 28, 2023

(30) Foreign Application Priority Data

Jun. 24, 2022 (JP) ................................. 2022-101648

(51) Int. Cl.
*H10F 39/00* (2025.01)
*H10F 39/18* (2025.01)
(52) U.S. Cl.
CPC ..... *H10F 39/80377* (2025.01); *H10F 39/186*
(2025.01); *H10F 39/1865* (2025.01); *H10F*
*39/8023* (2025.01); *H10F 39/8027* (2025.01);
*H10F 39/8033* (2025.01); *H10F 39/8037*
(2025.01); *H10F 39/807* (2025.01)
(58) Field of Classification Search
CPC .... H10F 39/18; H10F 39/186; H10F 39/1865;
H10F 39/802; H10F 39/8023; H10F
39/8027; H10F 39/803; H10F 39/8033;
H10F 39/8037; H10F 39/80377; H10F
39/807
See application file for complete search history.

(56) References Cited

U.S. PATENT DOCUMENTS

2011/0242386 A1    10/2011   Machida
2016/0204150 A1*    7/2016   Oh ........................ H10F 39/812
                                                257/229

(Continued)

FOREIGN PATENT DOCUMENTS

JP        2006024907 A       1/2006
JP        2010087379 A       4/2010
JP        2010136110 A       6/2010

(Continued)

*Primary Examiner* — Matthew E Warren
(74) *Attorney, Agent, or Firm* — Canon U.S.A., Inc. IP
Division

(57) ABSTRACT

A photoelectric conversion device includes a pixel including
an amplifier transistor generating a signal according to
charge generated in a photoelectric conversion unit and a
select transistor controlling an output of the signal, and an
output line outputting the signal from the pixel. The photo-
electric conversion unit includes a first semiconductor
region for accumulating charge, the select transistor includes
a second semiconductor region to which the output line is
connected, and the pixel further includes a third semicon-
ductor region being capable of discharging charge. The
second semiconductor region is adjacent to the first semi-
conductor region via a first element isolation structure, and
is adjacent to the third semiconductor region via a second
element isolation structure. A shortest distance between the
first and second semiconductor regions via the first element
isolation structure is greater than a shortest distance between
the second and third semiconductor regions via the second
element isolation structure.

18 Claims, 16 Drawing Sheets

(56)                   References Cited

U.S. PATENT DOCUMENTS

| | | | | |
|---|---|---|---|---|
| 2017/0345853 A1* | 11/2017 | Kato | ........................ | G02B 7/34 |
| 2023/0069364 A1* | 3/2023 | Hayashi | .............. | H10F 39/8037 |

FOREIGN PATENT DOCUMENTS

| | | | | | |
|---|---|---|---|---|---|
| JP | 2013008989 | A | | 1/2013 | |
| JP | 2013058505 | A * | 3/2013 | |
| JP | 2020068267 | A | | 4/2020 | |
| JP | 2023007420 | A * | 1/2023 | ........... H10F 39/803 |
| KR | 102611545 | B1 * | 12/2023 | ........... H10F 39/199 |
| WO | WO-2020045142 | A1 * | 3/2020 | ............. H04N 25/77 |
| WO | WO-2022209681 | A1 * | 10/2022 | ............. H10F 39/18 |
| WO | WO-2023053531 | A1 * | 4/2023 | ............. H10F 39/18 |

* cited by examiner

Figure 14:
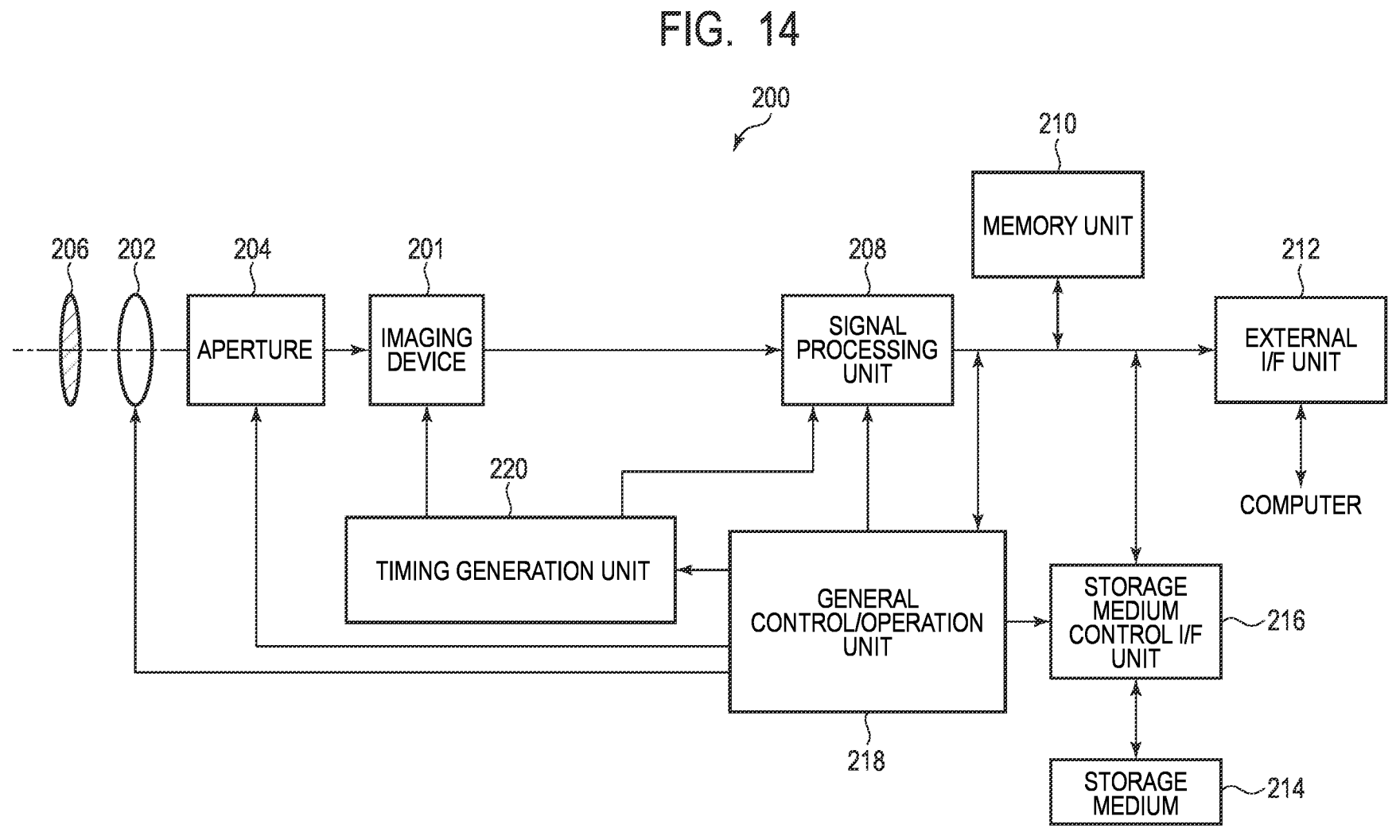

212 EXTERNAL I/F UNIT

COMPUTER

210 MEMORY UNIT

216 STORAGE MEDIUM CONTROL I/F UNIT

214 STORAGE MEDIUM

208 SIGNAL PROCESSING UNIT

218 GENERAL CONTROL/OPERATION UNIT

220 TIMING GENERATION UNIT

201 IMAGING DEVICE

204 APERTURE

202

206

300

| IMAGING DEVICE | 310 |
| IMAGE PROCESSING UNIT | 312 |
| PARALLAX ACQUISITION UNIT | 314 |
| DISTANCE ACQUISITION UNIT | 316 |
| COLLISION DETERMINATION UNIT | 318 |

320

VEHICLE INFORMATION
ACQUISITION DEVICE

330

CONTROL ECU

340

ALERT DEVICE

350

300

320

VEHICLE INFORMATION
ACQUISITION DEVICE

CONTROL ECU     ALERT DEVICE 330     340

PHOTOELECTRIC CONVERSION DEVICE

BACKGROUND

Technical Field

The aspect of the embodiments relates to a photoelectric conversion device.

Description of the Related Art

In recent years, CMOS image sensors suitable for high-speed readout have been widely used in imaging systems such as digital still cameras and digital video cameras. Japanese Patent Application Laid-Open No. 2013-008989 discloses a CMOS image sensor configured to suppress the so-called blooming that is a phenomenon in which charges leak from a photodiode in a saturated state to a photodiode in an adjacent pixel, by disposing a charge discharging region between the pixels.

However, charges leaking into the photodiode are not limited to charges overflowing from the photodiode of the adjacent pixel, and charges overflowing from other portions may leak into the photodiode. According to the technique described in Japanese Patent Application Laid-Open No. 2013-008989, it is not always possible to sufficiently suppress charges leaking into the photodiode.

SUMMARY

According to an embodiment of the disclosure, there is provided a photoelectric conversion device including a pixel provided on a semiconductor substrate and including a photoelectric conversion unit, a floating diffusion to which charge generated in the photoelectric conversion unit is transferred, an amplifier transistor that generates a signal according to a voltage of the floating diffusion, and a select transistor that controls an output of the signal, and an output line to which the signal from the pixel is output, wherein the photoelectric conversion unit includes a first semiconductor region of a first conductivity type for storing charge generated by photoelectric conversion, wherein the select transistor includes a second semiconductor region of the first conductivity type forming a node to which the output line is connected, wherein the pixel further includes a third semiconductor region of the first conductivity type configured to discharge charge, wherein the second semiconductor region is adjacent to the first semiconductor region with a first element isolation structure interposed therebetween, and is adjacent to the third semiconductor region with a second element isolation structure interposed therebetween, and wherein a shortest distance between the first semiconductor region and the second semiconductor region via the first element isolation structure is greater than a shortest distance between the second semiconductor region and the third semiconductor region via the second element isolation structure.

According to another embodiment of the disclosure, there is provided a photoelectric conversion device including a pixel provided on a semiconductor substrate and including a photoelectric conversion unit, a floating diffusion to which charge generated in the photoelectric conversion unit is transferred, an amplifier transistor that generates a signal according to a voltage of the floating diffusion, and a select transistor that controls an output of the signal, and an output line to which the signal from the pixel is output, wherein the photoelectric conversion unit includes a first semiconductor region of a first conductivity type for storing charge of a first polarity generated by photoelectric conversion, wherein the select transistor includes a second semiconductor region of the first conductivity type forming a node to which the output line is connected, wherein the pixel further includes a third semiconductor region of the first conductivity type configured to discharge charge of the first polarity, wherein the second semiconductor region is adjacent to the first semiconductor region with a first element isolation structure interposed therebetween, and is adjacent to the third semiconductor region with a second element isolation structure interposed therebetween, and wherein a potential barrier for the charge of the first polarity of the first element isolation structure between the first semiconductor region and the second semiconductor region is higher than a potential barrier for the charge of the first polarity of the second element isolation structure between the second semiconductor region and the third semiconductor region.

Further features of the disclosure will become apparent from the following description of exemplary embodiments with reference to the attached drawings.

BRIEF DESCRIPTION OF THE DRAWINGS

FIG. 3 is a timing chart illustrating an operation of a pixel in the photoelectric conversion device according to the first embodiment of the disclosure.

FIG. 14 is a block diagram illustrating a schematic configuration of an imaging system according to a ninth embodiment of the disclosure.

DESCRIPTION OF THE EMBODIMENTS

Exemplary embodiments of the disclosure will now be described in detail in accordance with the accompanying drawings.

First Embodiment

Figure 1:
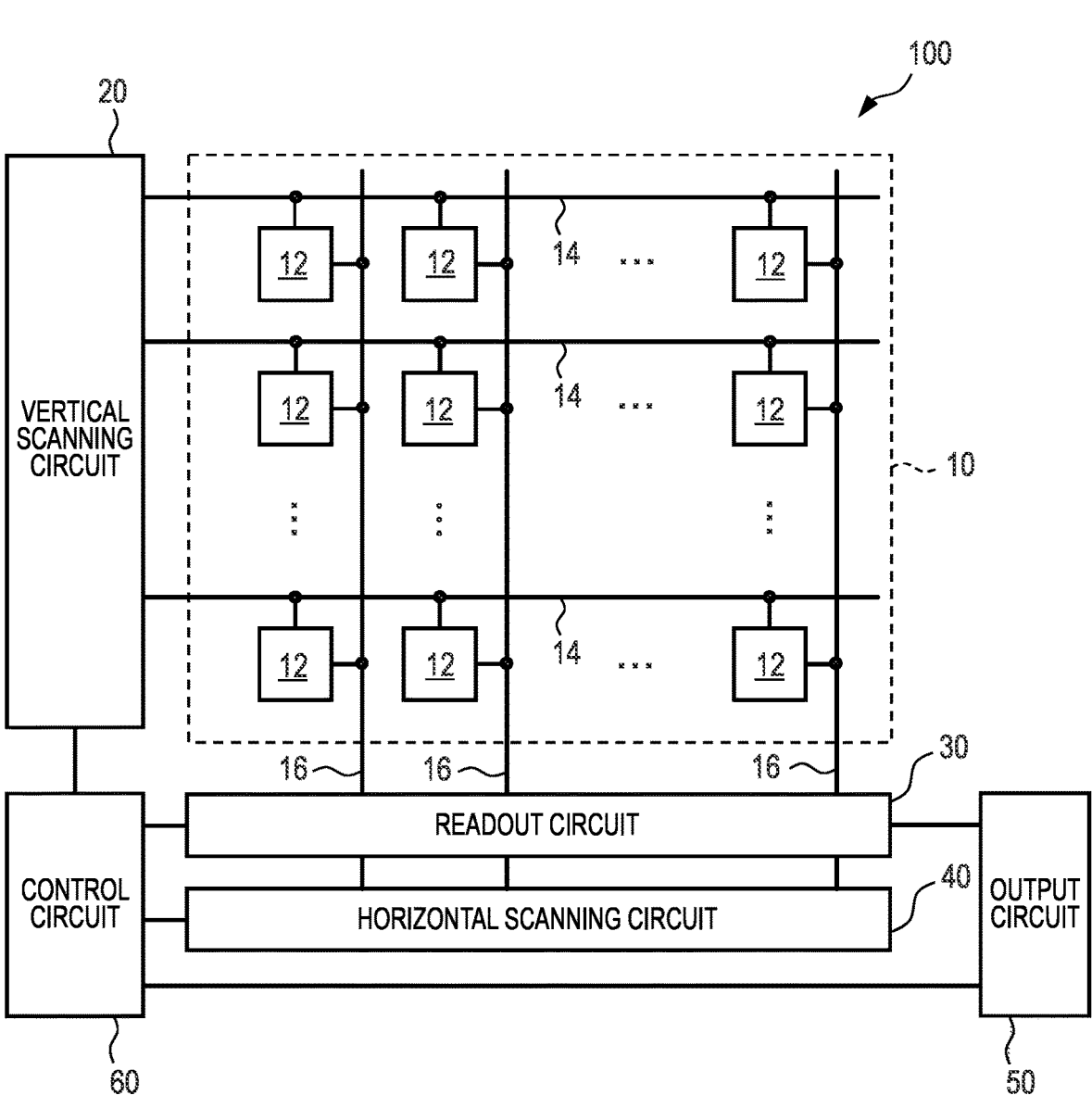
FIG. 1 is a block diagram illustrating a schematic configuration of a photoelectric conversion device according to a first embodiment of the disclosure.
Figure 2:
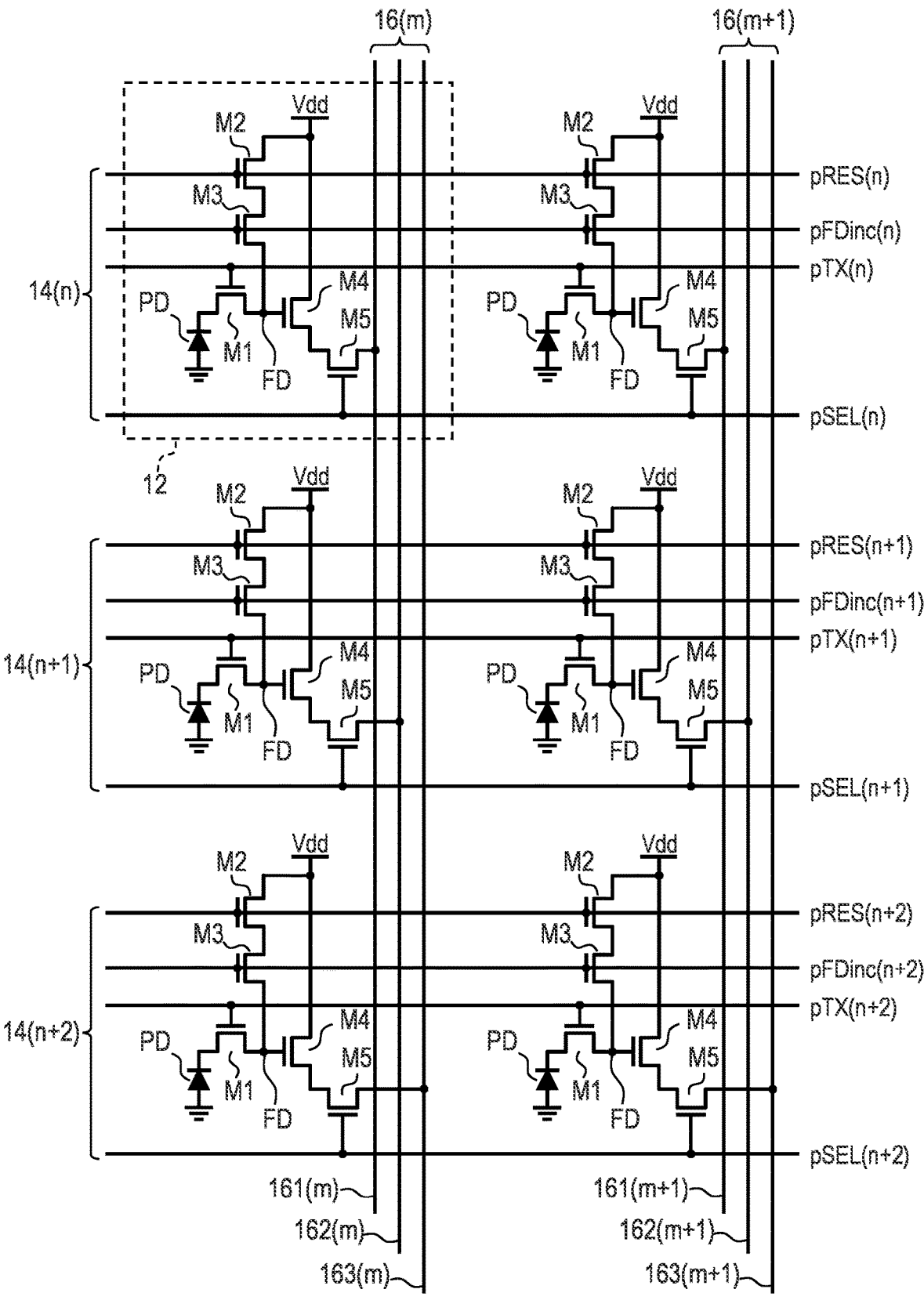
FIG. 2 is an equivalent circuit diagram illustrating a configuration example of a pixel in the photoelectric conversion device according to the first embodiment of the disclosure.
Figure 3:
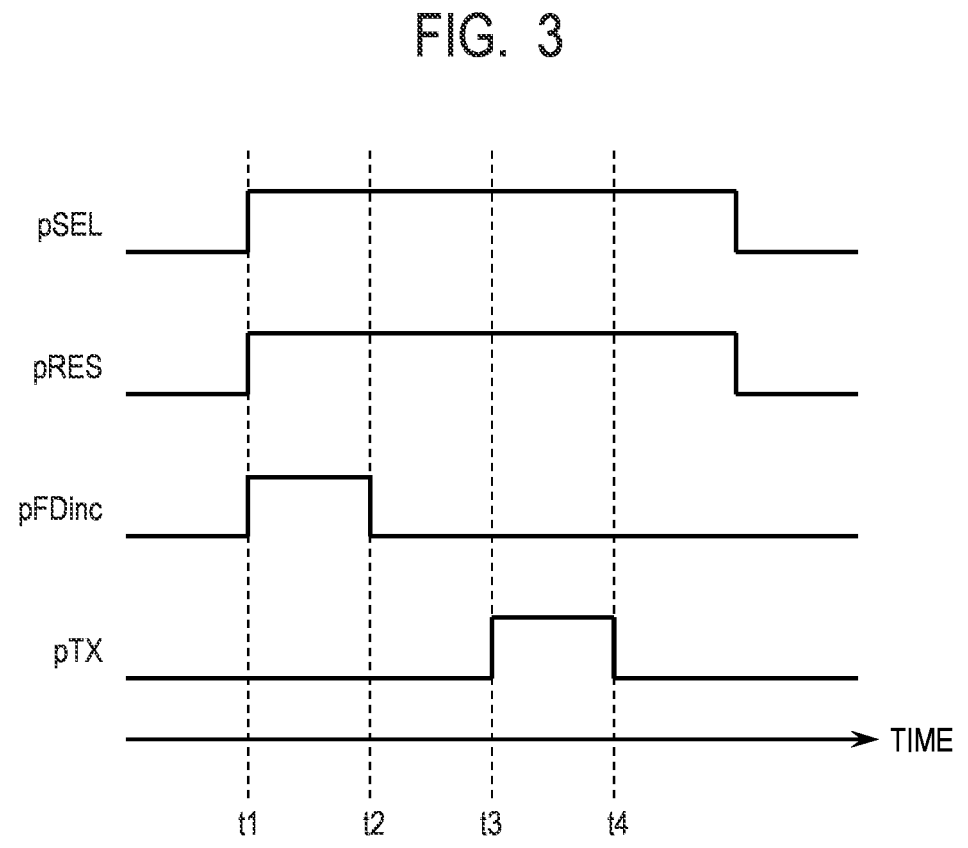
Figure 4A:
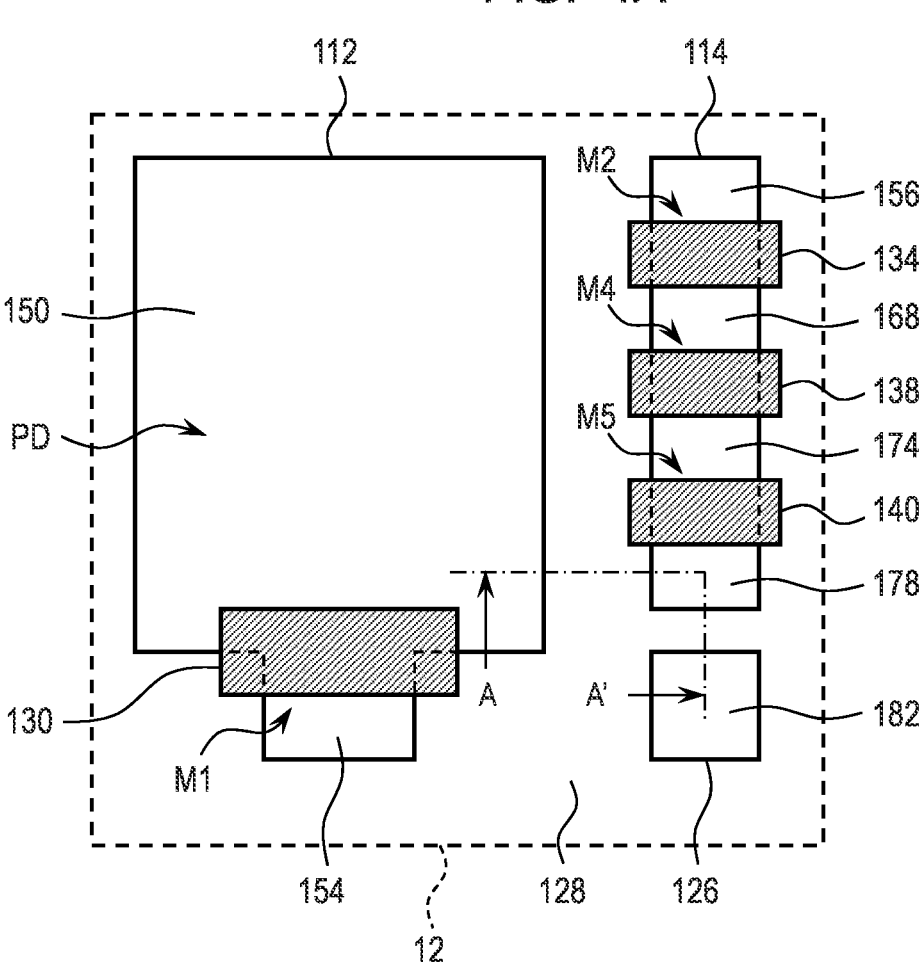
FIG. 4A is a plan view illustrating a structure of the pixel in the photoelectric conversion device according to the first embodiment of the disclosure.
Figure 4B:
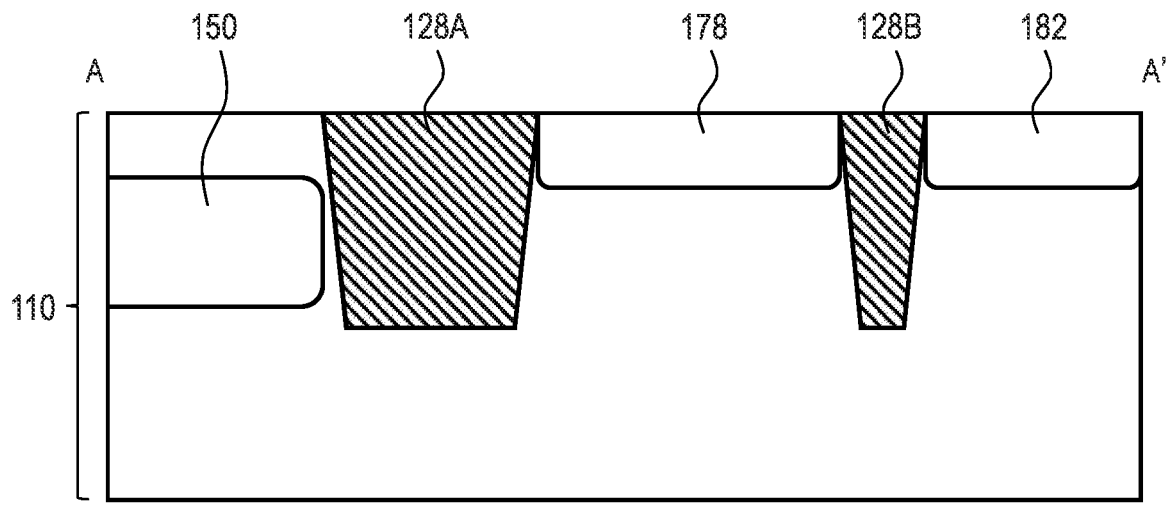
FIG. 4B is a cross-sectional view illustrating a structure of the pixel in the photoelectric conversion device according to the first embodiment of the disclosure.

A photoelectric conversion device according to a first embodiment of the disclosure will be described with reference to FIG. 1 to FIG. 4B. FIG. 1 is a block diagram illustrating a schematic configuration of a photoelectric conversion device according to the present embodiment. FIG. 2 is an equivalent circuit diagram illustrating a configuration example of a pixel in the photoelectric conversion device according to the present embodiment. FIG. 3 is a timing chart illustrating an operation of the pixel in the photoelectric conversion device according to the present embodiment. FIG. 4A is a plan view illustrating a structure of the pixel in the photoelectric conversion device according to the present embodiment. FIG. 4B is a cross-sectional view illustrating a structure of the pixel in the photoelectric conversion device according to the present embodiment.

As illustrated in FIG. 1, the photoelectric conversion device according to the present embodiment includes a pixel region 10, a vertical scanning circuit 20, a readout circuit 30, a horizontal scanning circuit 40, an output circuit 50, and a control circuit 60.

The pixel region 10 includes a plurality of pixels 12 arranged in a matrix form over a plurality of rows and a plurality of columns. Each pixel 12 includes a photoelectric conversion unit including a photoelectric conversion element such as a photodiode, and outputs a pixel signal corresponding to an amount of incident light. The number of rows and columns of the pixel array arranged in the pixel region 10 is not particularly limited. In the pixel region 10, in addition to effective pixels which output pixel signals according to an amount of incident light, optical black pixels in which the photoelectric conversion units are shielded from light, dummy pixels which do not output signals, and the like may be arranged.

In each row of the pixel array in the pixel region 10, a control line 14 is arranged so as to extend in a first direction (a lateral direction in FIG. 1). Each of the control lines 14 is connected to the pixels 12 in the corresponding row arranged in the first direction, and serves as a signal line common to these pixels 12. Each of the control lines 14 may include a plurality of signal lines. The control lines 14 are connected to the vertical scanning circuit 20. The first direction in which the control lines 14 extend may be referred to as a row direction or a horizontal direction.

In each column of the pixel array in the pixel region 10, an output line 16 is arranged so as to extend in a second direction (a vertical direction in FIG. 1) intersecting with the first direction. Each of the output lines 16 is connected to the pixels 12 in the corresponding column arranged in the second direction, and serves as a signal line common to these pixels 12. Each of the output lines 16 may include a plurality of signal lines. The output lines 16 are connected to the readout circuit 30. The second direction in which the output lines 16 extend may be referred to as a column direction or a vertical direction.

The vertical scanning circuit 20 has a function of generating control signals for driving the pixels 12 in accordance with control signals from the control circuit 60 and supplying the generated control signals to the pixels 12 via the control lines 14. The vertical scanning circuit 20 may be configured using a shift register or an address decoder. The vertical scanning circuit 20 drives the pixels 12 arranged in the pixel region 10 in units of rows by a control signal supplied via the control line 14. The signals read out from the pixels 12 in units of rows are input to the readout circuit 30 via the output line 16 of each column.

The readout circuit 30 has a function of holding pixel signals read out from the pixel region 10 and performing predetermined processing on the pixel signals, for example, signal processing such as correction processing by correlated double sampling, amplification processing, and analog-to-digital conversion processing. The readout circuit 30 includes a signal holding circuit for holding pixel signals output from the pixel region 10.

The horizontal scanning circuit 40 has a function of generating control signals for sequentially transferring the pixel signals processed by the readout circuit 30 to the output circuit 50 for each column in accordance with control signals from the control circuit 60, and supplying the generated control signals to the readout circuit 30. The horizontal scanning circuit 40 may be configured using a shift register or an address decoder.

The output circuit 50 may include a buffer amplifier, a differential amplifier, and the like, and has a function of executing predetermined signal processing on the pixel signals of the columns selected by the horizontal scanning circuit 40, and outputting the processed pixel data to the outside of the photoelectric conversion device 100. Examples of the signal processing performed by the output circuit 50 include correction processing by correlated double sampling and amplification processing.

The control circuit 60 has a function of supplying control signals for controlling operations and timings thereof of the vertical scanning circuit 20, the readout circuit 30, the horizontal scanning circuit 40, and the output circuit 50. Part or all of the control signals supplied to the vertical scanning circuit 20, the readout circuit 30, the horizontal scanning circuit 40, and the output circuit 50 may be supplied from the outside of the photoelectric conversion device 100.

Next, a configuration example of the pixel 12 in the photoelectric conversion device according to the present embodiment will be described with reference to FIG. 2. FIG. 2 illustrates six pixels 12 arranged in blocks of three rows (n-th row to (n+2)-th row)×two columns (m-th column to (m+1)-th column) among the plurality of pixels 12 constituting the pixel region 10. In part of the reference numerals illustrated in FIG. 2, reference numerals indicating row numbers or column numbers are denoted by parentheses.

Each of the pixels 12 may include a photoelectric conversion unit PD, a transfer transistor M1, a reset transistor M2, an amplifier transistor M4, and a select transistor M5. As illustrated in FIG. 2, each of the pixels 12 may further include a capacitance addition transistor M3. Here, a pixel configuration including the capacitance addition transistor M3 will be described. The transfer transistor M1, the reset transistor M2, the capacitance addition transistor M3, the amplifier transistor M4 and the select transistor M5 may be formed of MOS transistors. Each pixel 12 may include a microlens and a color filter arranged on the optical path until incident light is guided to the photoelectric conversion unit PD. The microlens collects incident light to the photoelectric conversion unit PD. The color filter selectively transmits light of a predetermined color.

The photoelectric conversion unit PD may be, for example, a photodiode whose anode is connected to a ground node and whose cathode is connected to a source of the transfer transistor M1. A drain of the transfer transistor M1 is connected to a source of the capacitance addition transistor M3 and a gate of the amplifier transistor M4. The connection node of the drain of the transfer transistor M1, the source of the capacitance addition transistor M3, and the gate of the amplifier transistor M4 is a so-called floating diffusion FD. The capacitance component (floating diffusion capacitance) connected to the floating diffusion FD functions as a charge holding portion.

A drain of the capacitance addition transistor M3 is connected to a source of the reset transistor M2. In the case of the pixel configuration that does not include the capacitance addition transistor M3, the source of the reset transistor M2 is connected to the floating diffusion FD. A drain of the reset transistor M2 and a drain of the amplifier transistor M4 are connected to a power supply voltage node (voltage: Vdd). A source of the amplifier transistor M4 is connected to a drain of the select transistor M5. A source of the select transistor M5 is connected to the output line 16. The voltage supplied to the drain of the reset transistor M2 and the voltage supplied to the drain of the amplifier transistor M4 may be the same or different.

In the case of the pixel configuration of FIG. 2, the control line 14 of each row includes four signal lines including a signal line connected to the gate of the transfer transistor M1, a signal line connected to the gate of the capacitance addition transistor, a signal line connected to the gate of the reset transistor M2, and a signal line connected to the gate of the select transistor M5. A control signal pTX is supplied from the vertical scanning circuit 20 to the signal line connected to the gate of the transfer transistor M1. A control signal pRES is supplied from the vertical scanning circuit 20 to the signal line connected to the gate of the reset transistor M2. A control signal pFDinc is supplied from the vertical scanning circuit 20 to the signal line connected to the gate of the capacitance addition transistor M3. A control signal pSEL is supplied from the vertical scanning circuit 20 to the signal line connected to the gate of the select transistor M5. When each transistor is formed of an n-channel MOS transistor, when a high-level control signal is supplied from the vertical scanning circuit 20, the corresponding transistor is turned on. When a low-level control signal is supplied from the vertical scanning circuit 20, the corresponding transistor is turned off.

The output line 16 of each column includes three signal lines 161, 162, and 163. The three signal lines 161, 162, and 163 are connected to different pixels 12 in the same column. For example, as illustrated in FIG. 2, the pixel 12 in each column arranged in the n-th row may be connected to the signal line 161 of the corresponding column. The pixel 12 in each column arranged in the (n+1)-th row may be connected to a signal line 162 in the corresponding column. The pixel 12 in each column arranged in the (n+2)-th row may be connected to a signal line 163 in the corresponding column. Similarly to these pixels 12, the pixels 12 in the other rows are connected to any one of the signal lines 161, 162, and 163 in the corresponding columns. The number of signal lines constituting the output line 16 in each column is not limited to three, and may be two or less, or four or more.

In the present embodiment, a description will be given assuming a case where electrons among electron-hole pairs generated in the photoelectric conversion unit PD by light incidence are used as a signal charge. When electrons are used as the signal charge, each transistor included in the pixel 12 may be formed of an n-channel MOS transistor. However, the signal charge is not limited to electrons, and holes may be used as the signal charge. When holes are used as the signal charge, the conductivity types of the transistors and the semiconductor regions are opposite to those described in the present embodiment. In this specification, when the first conductivity type is n-type, the second conductivity type is p-type, and when the first conductivity type is p-type, the second conductivity type is n-type. When the charge of the first polarity is negative charge (electron), the charge of the second polarity is positive charge (hole), and when the charge of the first polarity is positive charge (hole), the charge of the second polarity is negative charge (electron).

In addition, the term "source" or "drain" of the MOS transistor may vary depending on the conductivity type of the transistor, the target function and the like. Some or all of names of the source and the drain used in the present embodiment are sometimes referred to as reverse names. In this specification, the source and the drain of each terminal of the MOS transistor are sometimes referred to as a main node, and the gate thereof is sometimes referred to as a control node.

The photoelectric conversion unit PD converts (photoelectrically converts) incident light into charge of an amount corresponding to the amount of the incident light, and accumulates the generated charge. The transfer transistor M1 is controlled to be on by the control signal pTX to transfer charge held in the photoelectric conversion unit PD to the floating diffusion FD. The floating diffusion FD holds the charge transferred from the photoelectric conversion unit PD and sets the voltage of the input node of the amplifier unit (the gate of the amplifier transistor M4) to a voltage corresponding to the capacitance value (floating diffusion capacitance) and the amount of the transferred charge.

The capacitance addition transistor M3 is controlled by a control signal pFDinc, and has a role of switching the capacitance value of the floating diffusion FD according to an operation state of the capacitance addition transistor M3. That is, the capacitance addition transistor M3 adds the gate capacitance thereof to the capacitance of the floating diffusion FD by turning on, and separates the gate capacitance thereof from the floating diffusion FD by turning off.

The reset transistor M2 is controlled by the control signal pRES, and resets the floating diffusion FD to a predetermined voltage corresponding to the voltage Vdd by turning on at the same time as the capacitance addition transistor M3. At this time, the photoelectric conversion unit PD may be reset by turning on the transfer transistor M1.

The select transistor M5 is controlled by the control signal pSEL, and sets the pixel 12 to a state (selected state) where the signal of the pixel 12 is enable to output to the output line 16 by turning on. That is, the select transistor M5 controls the output of a signal to the output line 16. The amplifier transistor M4 is configured such that the voltage Vdd is supplied to the drain and a bias current is supplied from a current source (not illustrated) to the source via the select transistor M5, and constitutes an amplifier unit (source follower circuit) having the gate as an input node. Accordingly, the amplifier transistor M4 generates a signal corresponding to the voltage of the floating diffusion FD, and outputs the signal to the output line 16 via the select transistor M5.

Next, a basic operation of the pixel 12 will be described with reference to FIG. 3. FIG. 3 illustrates, as an example, a timing chart when a pixel signal at a low luminance is output. The horizontal axis represents time, and the vertical axis represents voltage. FIG. 3 illustrates waveforms of the control signals pSEL, pRES, pFDinc, and pTX supplied from the vertical scanning circuit 20 to the pixel 12.

Immediately before time t1, it is assumed that the control signals pSEL, pRES, pFDinc, and pTX are at low-level. At the time t1, the vertical scanning circuit 20 controls the control signals pSEL, pRES, and pFDinc from low-level to high-level. As a result, the select transistor M5, the reset transistor M2, and the capacitance addition transistor M3 are turned on, whereby the pixel 12 is selected and the floating diffusion FD is reset to a voltage corresponding to the voltage Vdd.

At time t2, the vertical scanning circuit 20 controls the control signal pFDinc from high-level to low-level. As a result, the capacitance addition transistor M3 is turned off, the reset state of the floating diffusion FD is released, and the gate capacitance of the capacitance addition transistor M3 is isolated from the floating diffusion FD. Thereby, the capacitance of the floating diffusion FD at the time of readout may be reduced, and noise may be reduced. After the capacitance addition transistor M3 turns off, a signal output from the amplifier transistor M4 to the output line 16 via the select transistor M5 becomes a reset level signal corresponding to the reset voltage of the floating diffusion FD.

During a period from time t3 to time t4, the vertical scanning circuit 20 controls the control signal pTX from low-level to high-level. As a result, the transfer transistor M1 is turned on, and the charge accumulated in the photoelectric conversion unit PD is transferred to the floating diffusion FD. Thus, the floating diffusion FD has a voltage corresponding to the capacitance value and the amount of charge transferred from the photoelectric conversion unit PD. After the control signal pTX transits to low-level at time t4 to turn off the transfer transistor M1, a signal output from the amplifier transistor M4 to the output line 16 via the select transistor M5 becomes a pixel signal corresponding to the amount of charge generated in the photoelectric conversion unit PD.

Next, a specific structure of the pixel 12 in the photoelectric conversion device according to the present embodiment will be described with reference to FIG. 4A and FIG. 4B. FIG. 4A is a plan view of the pixel 12, and FIG. 4B is a cross-sectional view taken along the line A-A' of FIG. 4A. In FIG. 4A, for simplicity, illustration of the capacitance addition transistor M3 is omitted. Further, in FIG. 4A, for simplicity, each region is illustrated as a rectangular shape, but this does not represent an actual shape of each portion, but indicates that at least each portion is disposed in this region.

FIG. 4A illustrates an example of a planar layout of one pixel 12. Active regions 112, 114, and 126 are defined in a region of a semiconductor substrate 110 where the pixel 12 is arranged. A region between the active regions 112, 114, and 126 is an element isolation region 128 for electrically isolating the active regions 112, 114, and 126 by an insulator structure such as STI (Shallow Trench Isolation) or p-n junction isolation. A gate electrode 130 of the transfer transistor M1, a gate electrode 134 of the reset transistor M2, a gate electrode 138 of the amplifier transistor M4 and a gate electrode 140 of the select transistor M5 are provided over the semiconductor substrate 110.

The active region 112 is provided with the photoelectric conversion unit PD, the transfer transistor M1, and a part of the floating diffusion FD among the components of the pixel 12. In the plan view, the gate electrode 130 is disposed across the active region 112. In the active region 112, an n-type semiconductor region 150 forming a charge accumulation region of the photoelectric conversion unit PD is provided on one side of the gate electrode 130. In the active region 112, an n-type semiconductor region 154 forming the part of the floating diffusion FD is provided on the other side of the gate electrode 130.

In the active region 114, among the components of the pixel 12, the other part of the floating diffusion FD, the reset transistor M2, the amplifier transistor M4 and the select transistor M5 are provided. In the plan view, each of the gate electrodes 134, 138, 140 is disposed across the active region 114. In the active region 114, an n-type semiconductor region 168 forming the drains of the reset transistor M2 and the amplifier transistor M4 is provided in a portion between the gate electrode 134 and the gate electrode 138. In the active region 114, an n-type semiconductor region 156 forming the source of the reset transistor M2 and the other part of the floating diffusion FD is provided in a portion adjacent to the n-type semiconductor region 168 via a channel region under the gate electrode 134. The n-type semiconductor region 156 is electrically connected to the n-type semiconductor region 154 and the gate electrode 138 via an interconnection (not illustrated). This connection node constitutes the floating diffusion FD as a whole. In the active region 114, an n-type semiconductor region 174 forming the source of the amplifier transistor M4 and the drain of the select transistor M5 is provided in a portion between the gate electrode 138 and the gate electrode 140. An n-type semiconductor region 178 constituting the source of the select transistor M5 is provided in a portion of the active region 114 adjacent to the n-type semiconductor region 174 via a channel region under the gate electrode 140.

The active region 126 serves as a charge discharging region for discharging leaked charges (electrons). An n-type semiconductor region 182 for enabling electric charges to be discharged is provided in the active region 126. The n-type semiconductor region 182 may be connected to a node to which a power supply voltage is supplied to actively discharge leaked charges to the outside.

As illustrated in FIG. 4A, the n-type semiconductor region 150 and the n-type semiconductor region 178 are adjacent to each other with the element isolation region 128 interposed therebetween. The n-type semiconductor region 178 and the n-type semiconductor region 182 are adjacent to each other with the element isolation region 128 interposed therebetween. As illustrated in FIG. 4B, an element isolation structure 128A made of an insulator structure such as STI is provided in the element isolation region 128 between the n-type semiconductor region 150 and the n-type semiconductor region 178. An element isolation structure 128B made of an insulator structure such as STI is provided in the element isolation region 128 between the n-type semiconductor region 178 and the n-type semiconductor region 182.

Here, in the photoelectric conversion device according to the present embodiment, the shortest distance between the n-type semiconductor regions 150 and 178 via the element isolation structure 128A is larger than the shortest distance between the n-type semiconductor regions 178 and 182 via the element isolation structure 128B. In other words, an isolation width between the n-type semiconductor regions 150 and 178 by the element isolation structure 128A is larger than an isolation width between the n-type semiconductor regions 178 and 182 by the element isolation structure 128B. By configuring the photoelectric conversion device in this manner, a potential barrier for electrons between the n-type semiconductor regions 150 and 178 is higher than a potential barrier for electrons between the n-type semiconductor regions 178 and 182. As a result, the electrons generated in the n-type semiconductor region 178 are prevented from leaking into the photoelectric conversion unit PD to cause a false signal, and the image quality may be improved.

For example, when the potential of the output line 16 decreases according to the output signal of the pixel 12 belonging to the readout row, electrons may be generated in the n-type semiconductor region 178 constituting the source of the select transistor M5 of the pixel 12 belonging to the non-readout row. By making the isolation width of the element isolation structure 128A wider than the isolation width of the element isolation structure 128B, the electrons more easily flow into the n-type semiconductor region 182 beyond the element isolation structure 128B than flow into the n-type semiconductor region 150 beyond the element isolation structure 128A. As a result, leakage of electrons generated in the n-type semiconductor region 178 into the photoelectric conversion unit PD may be suppressed, and false signals may be reduced.

As described above, according to the present embodiment, it is possible to effectively suppress generation of a false signal caused by charges leaking into the photoelectric conversion unit of the pixel, and to acquire a high-quality image.

Second Embodiment

A photoelectric conversion device according to a second embodiment of the disclosure will be described with reference to FIG. 5A and FIG. 5B. Components similar to those of the photoelectric conversion device according to the first embodiment are denoted by the same reference numerals, and descriptions thereof will be omitted or simplified.

The photoelectric conversion device according to the present embodiment is the same as the photoelectric conversion device according to the first embodiment except that the layout of each pixel 12 is different. In the present embodiment, differences from the photoelectric conversion device according to the first embodiment will be mainly described, and description of the same portions as those of the photoelectric conversion device according to the first embodiment will be appropriately omitted.

Figure 5A:
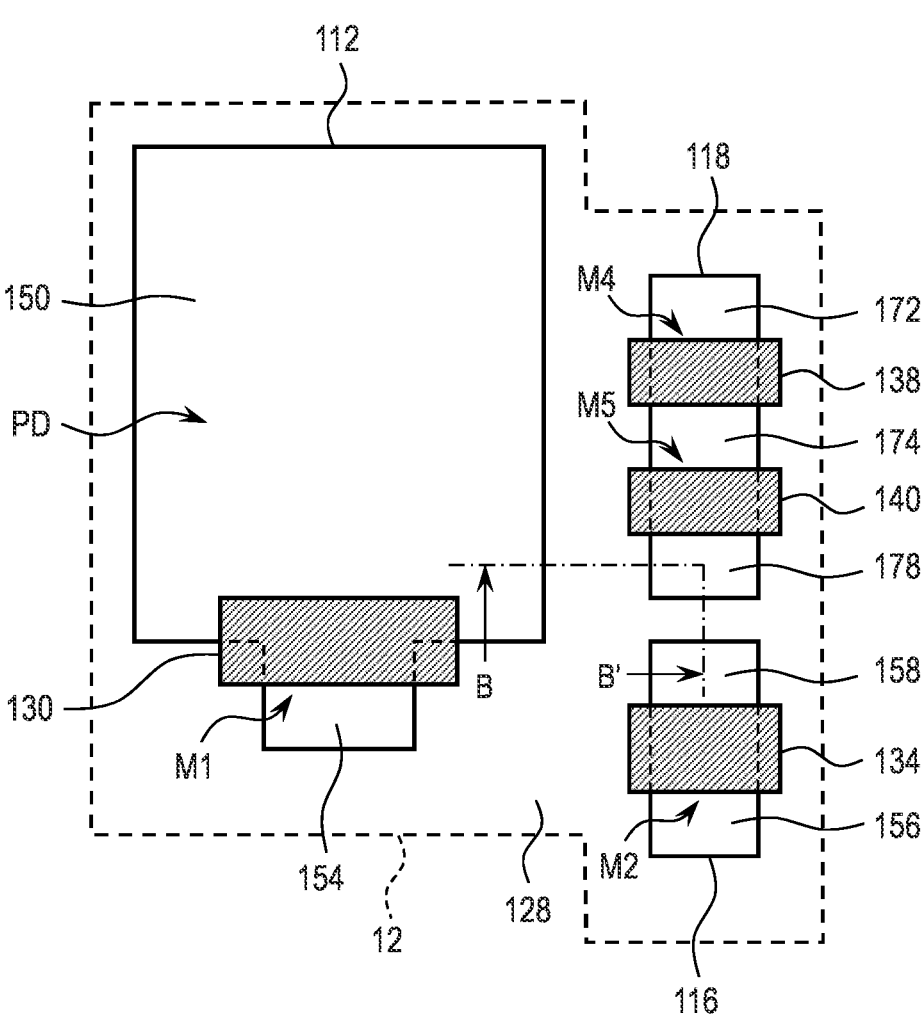
FIG. 5A is a plan view illustrating a structure of a pixel in a photoelectric conversion device according to a second embodiment of the disclosure.
Figure 5B:
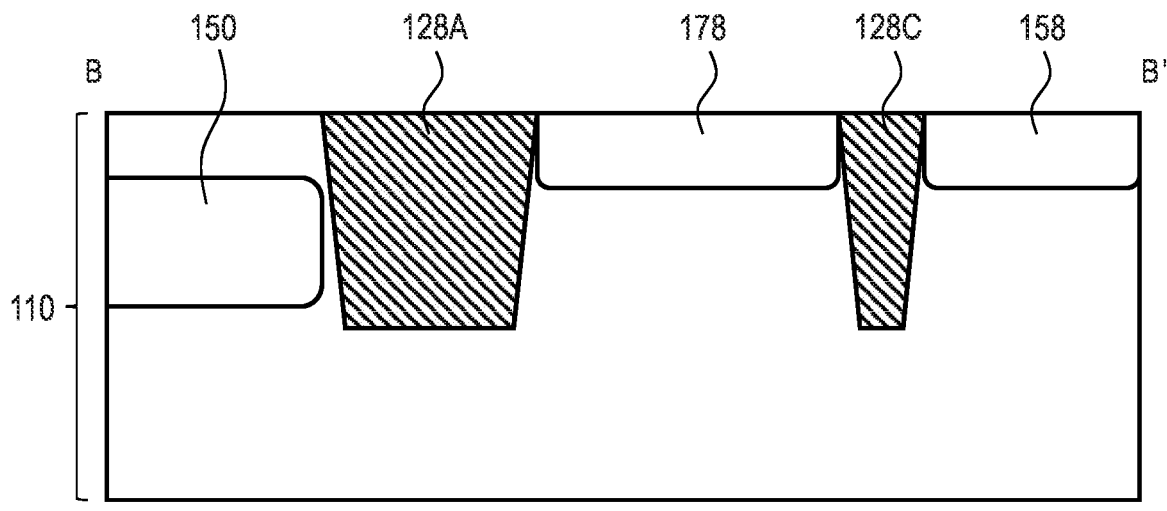
FIG. 5B is a cross-sectional view illustrating a structure of the pixel in the photoelectric conversion device according to the second embodiment of the disclosure.

FIG. 5A is a plan view illustrating a structure of a pixel in the photoelectric conversion device according to the present embodiment. FIG. 5B is a cross-sectional view illustrating a structure of the pixel in the photoelectric conversion device according to the present embodiment. FIG. 5A is a plan view of the pixel 12, and FIG. 5B is a cross-sectional view taken along the line B-B' of FIG. 5A. In FIG. 5A, for simplicity, illustration of the capacitance addition transistor M3 is omitted. Further, in FIG. 5A, for simplicity, each region is illustrated as a rectangular shape, but this does not represent an actual shape of each portion, but indicates that at least each portion is disposed in this region.

FIG. 5A illustrates an example of a planar layout of one pixel 12. Active regions 112, 116, and 118 are defined in a region of a semiconductor substrate 110 where the pixel 12 is arranged. A region between the active regions 112, 116, and 118 is an element isolation region 128 for electrically isolating the active regions 112, 116, and 118 by an insulator structure such as STI or p-n junction isolation. A gate electrode 130 of the transfer transistor M1, a gate electrode 134 of the reset transistor M2, a gate electrode 138 of the amplifier transistor M4, and a gate electrode 140 of the select transistor M5 are provided over the semiconductor substrate 110.

As in the first embodiment, the active region 112 is provided with the photoelectric conversion unit PD, the transfer transistor M1, and a part of the floating diffusion FD among the components of the pixel 12.

In the active region 116, of the constituent elements of the pixel 12, the other part of the floating diffusion FD, and the reset transistor M2 are provided. In the plan view, the gate electrode 134 is disposed across the active region 116. In the active region 116 on one side of the gate electrode 134, an n-type semiconductor region 156 constituting the other part of the floating diffusion FD and the source of the reset transistor M2 are provided. The n-type semiconductor region 156 is electrically connected to the n-type semiconductor region 154 and the gate electrode 138 via an interconnection (not illustrated). This connection node constitutes the floating diffusion FD as a whole. In the active region 116 on the other side of the gate electrode 134, an n-type semiconductor region 158 constituting the drain of the reset transistor M2 is provided.

In the active region 118, among the constituent elements of the pixel 12, an amplifier transistor M4 and a select transistor M5 are provided. In the plan view, each of the gate electrodes 138, 140 is disposed across the active region 118. In the active region 118 in a portion between the gate electrode 138 and the gate electrode 140, an n-type semiconductor region 174 forming the source of the amplifier transistor M4 and the drain of the select transistor M5 is provided. An n-type semiconductor region 172 forming the drain of the amplifier transistor M4 is provided in a portion of the active region 118 adjacent to the n-type semiconductor region 174 via a channel region under the gate electrode 138. An n-type semiconductor region 178 constituting the source of the select transistor M5 is provided in a portion of the active region 118 adjacent to the n-type semiconductor region 174 via a channel region under the gate electrode 140.

As illustrated in FIG. 5A, the n-type semiconductor region 150 and the n-type semiconductor region 178 are adjacent to each other with the element isolation region 128 interposed therebetween. The n-type semiconductor region 178 and the n-type semiconductor region 158 are adjacent to each other with the element isolation region 128 interposed therebetween. As illustrated in FIG. 5B, an element isolation structure 128A made of an insulator structure such as STI is provided in the element isolation region 128 between the n-type semiconductor region 150 and the n-type semiconductor region 178. An element isolation structure 128C made of an insulator structure such as STI is provided in the element isolation region 128 between the n-type semiconductor region 178 and the n-type semiconductor region 158.

Here, in the photoelectric conversion device according to the present embodiment, a distance between the n-type semiconductor regions 150 and 178 is larger than a distance between the n-type semiconductor regions 178 and 158. In other words, an isolation width between the n-type semiconductor regions 150 and 178 by the element isolation structure 128A is larger than an isolation width between the n-type semiconductor regions 178 and 158 by the element isolation structure 128C. By configuring the photoelectric conversion device in this manner, a potential barrier for electrons between the n-type semiconductor regions 150 and 178 is higher than a potential barrier for electrons between the n-type semiconductor regions 178 and 158. As a result, the electrons generated in the n-type semiconductor region 178 are prevented from leaking into the photoelectric conversion unit PD to cause a false signal, and the image quality may be improved.

When the potential of the output line 16 decreases, as described in the first embodiment, electrons may be generated in the n-type semiconductor region 178 constituting the source of the select transistor M5. By making the isolation width of the element isolation structure 128A wider than the isolation width of the element isolation structure 128C, the electrons more easily flow into the n-type semiconductor region 158 beyond the element isolation structure 128C than flow into the n-type semiconductor region 150 beyond the element isolation structure 128A. As a result, leakage of electrons generated in the n-type semiconductor region 178 into the photoelectric conversion unit PD may be suppressed, and false signals may be reduced.

In the present embodiment, the n-type semiconductor region 158, which is the electron discharge destination, is a semiconductor region constituting the drain of the reset transistor M2, and is connected to a node to which a power supply voltage is supplied. Accordingly, the electrons flowing into the n-type semiconductor region 158 are discharged via the power source. In the present embodiment, since the drain of the reset transistor M2 is used as the electron discharge destination, it is not necessary to separately provide the active region 126 as the electron discharge destination, and the layout efficiency may be improved as compared with the first embodiment.

As described above, according to the present embodiment, it is possible to effectively suppress generation of a false signal caused by charges leaking into the photoelectric conversion unit of the pixel, and to acquire a high-quality image.

Third Embodiment

A photoelectric conversion device according to a third embodiment of the disclosure will be described with reference to FIG. 6A and FIG. 6B. Components similar to those of the photoelectric conversion device according to the first or second embodiment are denoted by the same reference numerals, and descriptions thereof will be omitted or simplified.

The photoelectric conversion device according to the present embodiment is the same as the photoelectric conversion device according to the second embodiment except that the element isolation structure for isolating the n-type semiconductor regions 150 and 178 and the element isolation structure for isolating the n-type semiconductor regions 178 and 158 are different. In the present embodiment, differences from the photoelectric conversion device according to the second embodiment will be mainly described, and description of the same portions as those of the photoelectric conversion device according to the first or second embodiment will be appropriately omitted.

Figure 6A:
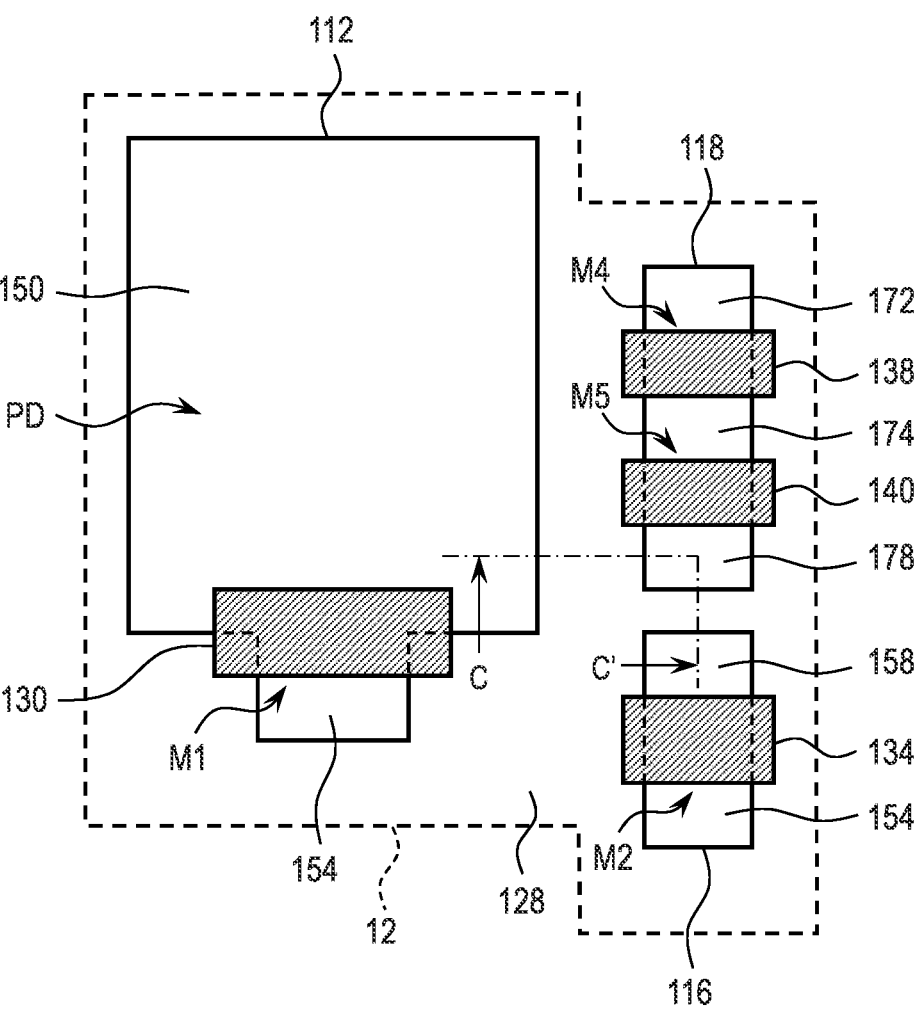
FIG. 6A is a plan view illustrating a structure of a pixel in a photoelectric conversion device according to a third embodiment of the disclosure.

FIG. 6A is a plan view illustrating a structure of a pixel in the photoelectric conversion device according to the present embodiment. FIG. 6B is a cross-sectional view illustrating a structure of the pixel in the photoelectric conversion device according to the present embodiment. FIG. 6A is a plan view of the pixel 12, and FIG. 6B is a cross-sectional view taken along the line C-C' of FIG. 6A. In FIG. 6A, for simplicity, illustration of the capacitance addition transistor M3 is omitted. Further, in FIG. 6A, for simplicity, each region is illustrated as a rectangular shape, but this does not represent an actual shape of each portion, but indicates that at least each portion is disposed in this region.

As illustrated in FIG. 6A, the planar layout of the pixels 12 in the photoelectric conversion device according to the present embodiment is similar to that of the photoelectric conversion device according to the second embodiment. That is, the n-type semiconductor region 150 and the n-type semiconductor region 178 are adjacent to each other with the element isolation region 128 interposed therebetween. The n-type semiconductor region 178 and the n-type semiconductor region 158 are adjacent to each other with the element isolation region 128 interposed therebetween. However, in the present embodiment, p-n junction isolation is used instead of the insulator structure used in the first and second embodiments as an element isolation structure for isolating the n-type semiconductor regions 150 and 178, and an element isolation structure for isolating the n-type semiconductor regions 178 and 158.

Figure 6B:
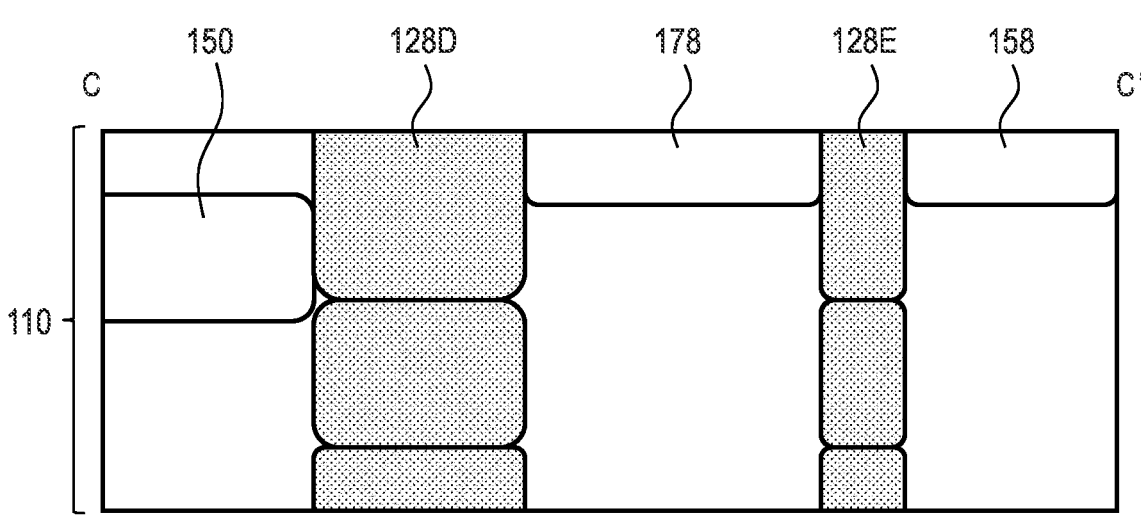
FIG. 6B is a cross-sectional view illustrating a structure of the pixel in the photoelectric conversion device according to the third embodiment of the disclosure.

That is, in the present embodiment, as illustrated in FIG. 6B, in the element isolation region 128 between the n-type semiconductor region 150 and the n-type semiconductor region 178, a p-type semiconductor region having a conductivity type opposite to that of the n-type semiconductor regions 150 and 178 is provided as an element isolation structure 128D. In the element isolation region 128 between the n-type semiconductor region 178 and the n-type semiconductor region 158, a p-type semiconductor region having a conductivity type opposite to that of the n-type semiconductor regions 178 and 158 is provided as an element isolation structure 128E. In FIG. 6B, it is assumed that the element isolation structures 128D and 128E are formed by a plurality of ion implantations, and it is schematically illustrated that the element isolation structures 128D and 128E are formed by a plurality of p-type semiconductor regions provided in different depths.

Here, in the photoelectric conversion device according to the present embodiment, a distance between the n-type semiconductor regions 150 and 178 is larger than a distance between the n-type semiconductor regions 178 and 158. In other words, an isolation width between the n-type semiconductor regions 150 and 178 by the element isolation structure 128D is larger than an isolation width between the n-type semiconductor regions 178 and 158 by the element isolation structure 128E. By configuring the photoelectric conversion device in this manner, a potential barrier for electrons between the n-type semiconductor regions 150 and 178 is higher than a potential barrier for electrons between the n-type semiconductor regions 178 and 158. As a result, the electrons generated in the n-type semiconductor region 178 are prevented from leaking into the photoelectric conversion unit PD to cause a false signal, and the image quality may be improved.

When the potential of the output line 16 decreases, as described in the first embodiment, electrons may be generated in the n-type semiconductor region 178 constituting the source of the select transistor M5. By making the isolation width of the element isolation structure 128D wider than the isolation width of the element isolation structure 128E, the electrons more easily flow into the n-type semiconductor region 158 beyond the element isolation structure 128E than flow into the n-type semiconductor region 150 beyond the element isolation structure 128D. As a result, leakage of electrons generated in the n-type semiconductor region 178 into the photoelectric conversion unit PD may be suppressed, and false signals may be reduced.

Further, in the present embodiment, since the p-n junction isolation is used as the element isolation structures 128D and 128E, electrons generated from defects existing at the interface between the element isolation insulating film such as STI and the semiconductor are reduced, and dark characteristics such as dark current may be improved.

As described above, according to the present embodiment, it is possible to effectively suppress generation of a false signal caused by charges leaking into the photoelectric conversion unit of the pixel, and to acquire a high-quality image.

Fourth Embodiment

A photoelectric conversion device according to a fourth embodiment of the disclosure will be described with reference to FIG. 7A and FIG. 7B. Components similar to those of the photoelectric conversion devices according to the first to third embodiments are denoted by the same reference numerals, and descriptions thereof will be omitted or simplified.

The photoelectric conversion device according to the present embodiment is the same as the photoelectric conversion device according to the third embodiment except that the relationship between the element isolation structure isolating the n-type semiconductor regions 150 and 178 and the element isolation structure isolating the n-type semiconductor regions 178 and 158 is different. In the present embodiment, differences from the photoelectric conversion device according to the third embodiment will be mainly described, and description of the same portions as those of the photoelectric conversion devices according to the first to third embodiments will be appropriately omitted.

Figure 7A:
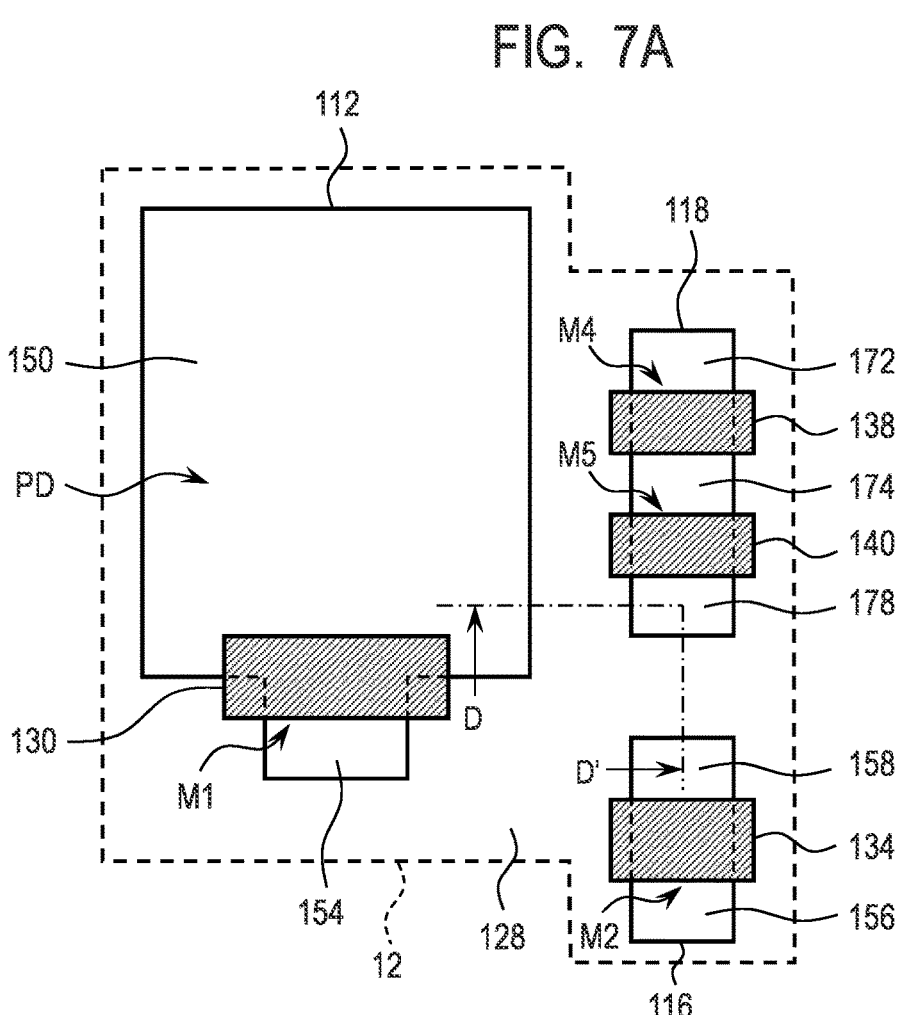
FIG. 7A is a plan view illustrating a structure of a pixel in a photoelectric conversion device according to a fourth embodiment of the disclosure.

FIG. 7A is a plan view illustrating a structure of a pixel in the photoelectric conversion device according to the present embodiment. FIG. 7B is a cross-sectional view illustrating a structure of the pixel in the photoelectric conversion device according to the present embodiment. FIG. 7A is a plan view of the pixel 12, and FIG. 7B is a cross-sectional view taken along the line D-D' of FIG. 7A. In FIG. 7A, for simplicity, illustration of the capacitance addition transistor M3 is omitted. Further, in FIG. 7A, for simplicity, each region is illustrated as a rectangular shape, but this does not represent an actual shape of each portion, but indicates that at least each portion is disposed in this region.

As illustrated in FIG. 7A, the basic planar layout of the pixels 12 in the photoelectric conversion device according to the present embodiment is similar to that of the photoelectric conversion device according to the third embodiment. That is, the n-type semiconductor region 150 and the n-type semiconductor region 178 are adjacent to each other with the element isolation region 128 interposed therebetween. The n-type semiconductor region 178 and the n-type semiconductor region 158 are adjacent to each other with the element isolation region 128 interposed therebetween. However, in the present embodiment, the relationship between the element isolation structure 128D isolating the n-type semiconductor regions 150 and 178 and an element isolation structure 128F isolating the n-type semiconductor regions 178 and 158 is different from that in the third embodiment.

Figure 7B:
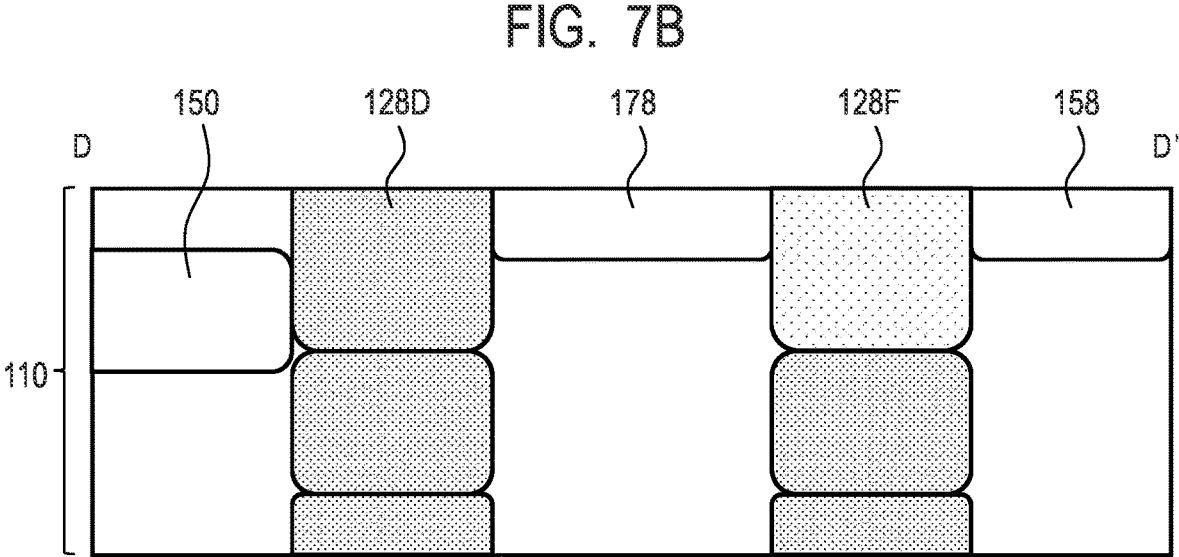
FIG. 7B is a cross-sectional view illustrating a structure of the pixel in the photoelectric conversion device according to the fourth embodiment of the disclosure.

That is, in the present embodiment, as illustrated in FIG. 7B, the impurity concentration of the p-type semiconductor region constituting the element isolation structure 128D is higher than the impurity concentration of the p-type semiconductor region constituting the element isolation structure 128F. In the p-type semiconductor region constituting the element isolation region 128, the higher the impurity concentration, the higher the potential barrier to electrons.

An isolation width between the n-type semiconductor regions 150 and 178 by the element isolation structure 128D does not necessarily need to be larger than an isolation width between the n-type semiconductor regions 178 and 158 by the element isolation structure 128F as in the case of the third embodiment. As a result of lowering the impurity concentration of the p-type semiconductor region constituting the element isolation structure 128F, a potential barrier for electrons between the n-type semiconductor regions 150 and 178 may be higher than a potential barrier for electrons between the n-type semiconductor regions 178 and 158. As long as this condition is satisfied, the isolation width between the n-type semiconductor regions 150 and 178 by the element isolation structure 128D may be equal to or less than the isolation width between the n-type semiconductor regions 178 and 158 by the element isolation structure 128F.

The impurity concentration of the p-type semiconductor region constituting the element isolation structure 128D need not necessarily be higher than the impurity concentration of the p-type semiconductor region constituting the element isolation structure 128F over the entire depth direction. For example, as illustrated in FIG. 7B, at least the concentration of the p-type impurity at the depth at which the n-type semiconductor regions 150 and 178 are disposed may be higher than the concentration of the p-type impurity at the depth at which the n-type semiconductor regions 178 and 158 are disposed.

By configuring the photoelectric conversion device in this manner, it is possible to suppress leakage of electrons generated in the n-type semiconductor region 178 into the photoelectric conversion unit PD to cause a false signal, thereby improving image quality. When the potential of the output line 16 decreases, as described in the first embodiment, electrons may be generated in the n-type semiconductor region 178 constituting the source of the select transistor M5. When the impurity concentration of the element isolation structure 128D is higher than the impurity concentration of the element isolation structure 128F, the electrons more easily flow into the n-type semiconductor region 158 beyond the element isolation structure 128F than flow into the n-type semiconductor region 150 beyond the element isolation structure 128D. As a result, leakage of electrons generated in the n-type semiconductor region 178 into the photoelectric conversion unit PD may be suppressed, and false signals may be reduced.

As described above, according to the present embodiment, it is possible to effectively suppress generation of a false signal caused by charges leaking into the photoelectric conversion unit of the pixel, and to acquire a high-quality image.

Fifth Embodiment

A photoelectric conversion device according to a fifth embodiment of the disclosure will be described with reference to FIG. 8A and FIG. 8B. Components similar to those of the photoelectric conversion devices according to the first to fourth embodiments are denoted by the same reference numerals, and descriptions thereof will be omitted or simplified.

The photoelectric conversion device according to the present embodiment is the same as the photoelectric conversion device according to the second embodiment except that the element isolation structure for isolating the n-type semiconductor regions 178 and 158 is different. In the present embodiment, differences from the photoelectric conversion device according to the second embodiment will be mainly described, and description of the same portions as those of the photoelectric conversion devices according to the first to fourth embodiments will be appropriately omitted.

Figures 8A, 8B:
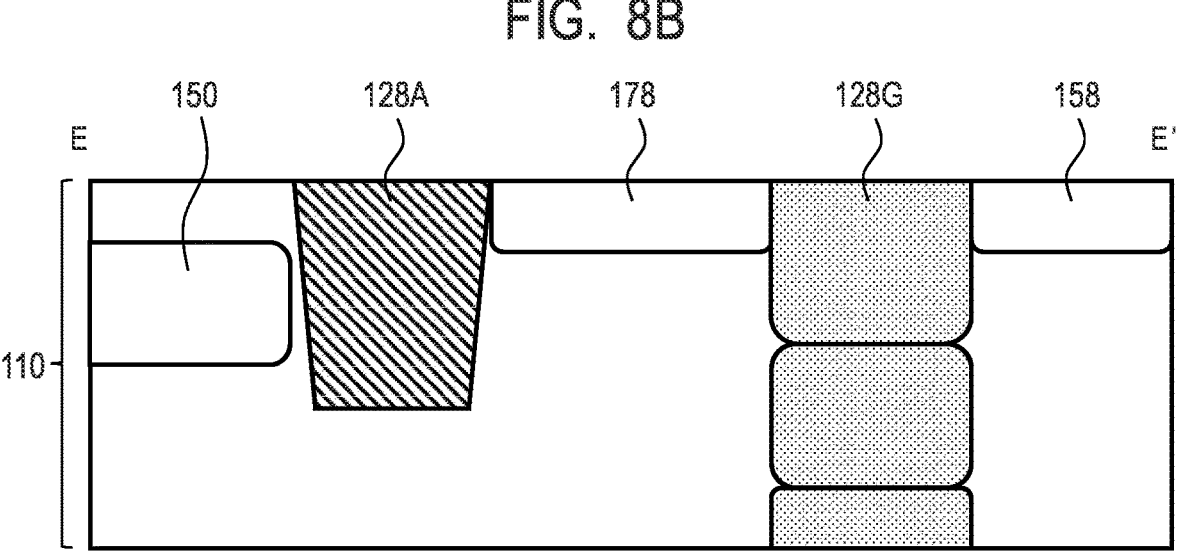
FIG. 8A is a plan view illustrating a structure of a pixel in a photoelectric conversion device according to a fifth embodiment of the disclosure.
FIG. 8B is a cross-sectional view illustrating a structure of the pixel in the photoelectric conversion device according to the fifth embodiment of the disclosure.

FIG. 8A is a plan view illustrating a structure of a pixel in the photoelectric conversion device according to the present embodiment. FIG. 8B is a cross-sectional view illustrating a structure of the pixel in the photoelectric conversion device according to the present embodiment. FIG. 8A is a plan view of the pixel 12, and FIG. 8B is a cross-sectional view taken along line E-E' of FIG. 8A. In FIG. 8A, for simplicity, illustration of the capacitance addition transistor M3 is omitted. Further, in FIG. 8A, for simplicity, each region is illustrated as a rectangular shape, but this does not represent an actual shape of each portion, but indicates that at least each portion is disposed in this region.

As illustrated in FIG. 8A, the basic planar layout of the pixels 12 in the photoelectric conversion device according to the present embodiment is similar to that of the photoelectric conversion device according to the second embodiment. That is, the n-type semiconductor region 150 and the n-type semiconductor region 178 are adjacent to each other with the element isolation region 128 interposed therebetween. The n-type semiconductor region 178 and the n-type semiconductor region 158 are adjacent to each other with the element isolation region 128 interposed therebetween. However, in the present embodiment, an element isolation structure 128G isolating the n-type semiconductor regions 178 and 158 is different from the element isolation structure 128C in the second embodiment.

That is, in the present embodiment, as illustrated in FIG. 8B, the element isolation structure 128A between the n-type semiconductor regions 150 and 178 is formed of an insulator structure, and the element isolation structure 128G between the n-type semiconductor regions 178 and 158 is formed of a p-type semiconductor region. In general, the device isolation capability of the insulator structure that physically inhibits charge transfer is higher than the device isolation capability of the p-n junction isolation that electrically inhibits charge transfer. Therefore, in comparison with the same isolation width, a potential barrier of the element isolation structure 128A with respect to electrons is higher than a potential barrier of the element isolation structure 128G with respect to electrons.

The isolation width between the n-type semiconductor regions 150 and 178 by the element isolation structure 128A does not necessarily need to be larger than the isolation width between the n-type semiconductor regions 178 and 158 by the element isolation structure 128G as in the case of the third embodiment. It is sufficient that the potential barrier for electrons between the n-type semiconductor regions 150 and 178 is higher than the potential barrier for electrons between the n-type semiconductor regions 178 and 158, as a result of configuring the element isolation structures 128A and 128G in this manner. As long as this condition is satisfied, the isolation width between the n-type semiconductor regions 150 and 178 by the element isolation structure 128A may be equal to or less than the isolation width between the n-type semiconductor regions 178 and 158 by the element isolation structure 128G.

By configuring the photoelectric conversion device in this manner, it is possible to suppress leakage of electrons generated in the n-type semiconductor region 178 into the photoelectric conversion unit PD to cause a false signal, thereby improving image quality. When the potential of the output line 16 decreases, as described in the first embodiment, electrons may be generated in the n-type semiconductor region 178 constituting the source of the select transistor M5. Since the element isolation structure 128A is formed of an insulator structure having a high element isolation capability, the electrons more easily flow into the n-type semiconductor region 158 beyond the element isolation structure 128G than flow into the n-type semiconductor region 150 beyond the element isolation structure 128A. As a result, leakage of electrons generated in the n-type semiconductor region 178 into the photoelectric conversion unit PD may be suppressed, and false signals may be reduced.

As described above, according to the present embodiment, it is possible to effectively suppress generation of a false signal caused by charges leaking into the photoelectric conversion unit of the pixel, and to acquire a high-quality image.

Sixth Embodiment

A photoelectric conversion device according to a sixth embodiment of the disclosure will be described with reference to FIG. 9A and FIG. 9B. Components similar to those of the photoelectric conversion devices according to the first to fifth embodiments are denoted by the same reference numerals, and descriptions thereof will be omitted or simplified.

The photoelectric conversion device according to the present embodiment is the same as the photoelectric conversion device according to the second embodiment except that the relationship between the element isolation structure isolating the n-type semiconductor regions 150 and 178 and the element isolation structure isolating the n-type semiconductor regions 178 and 158 is different. In the present embodiment, differences from the photoelectric conversion device according to the second embodiment will be mainly described, and description of the same portions as those of the photoelectric conversion devices according to the first to fifth embodiments will be appropriately omitted.

Figures 9A, 9B:
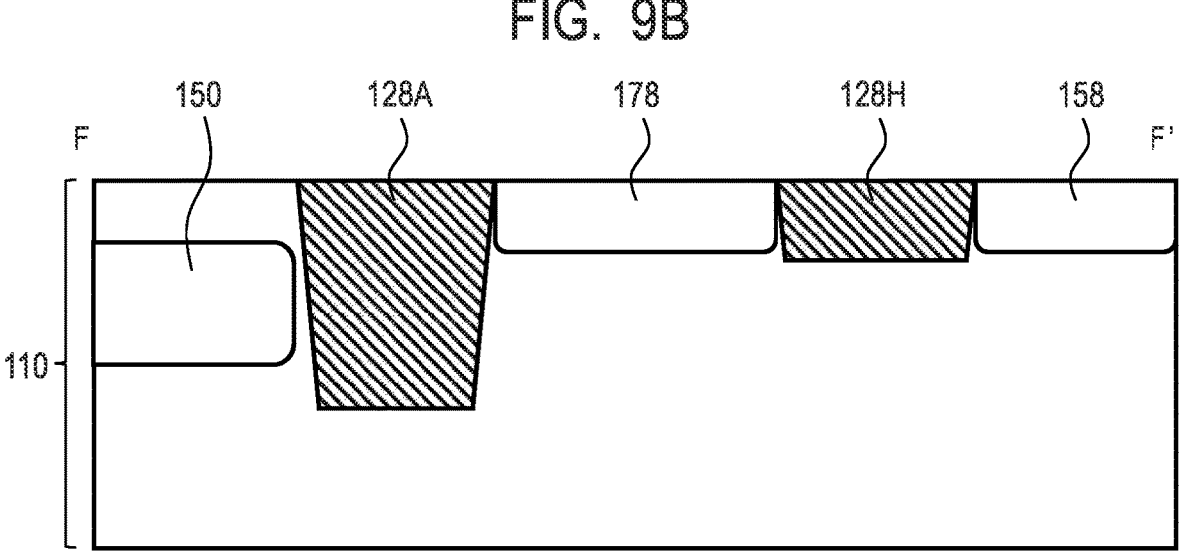
FIG. 9A is a plan view illustrating a structure of a pixel in a photoelectric conversion device according to a sixth embodiment of the disclosure.
FIG. 9B is a cross-sectional view illustrating a structure of the pixel in the photoelectric conversion device according to the sixth embodiment of the disclosure.

FIG. 9A is a plan view illustrating a structure of a pixel in the photoelectric conversion device according to the present embodiment. FIG. 9B is a cross-sectional view illustrating a structure of the pixel in the photoelectric conversion device according to the present embodiment. FIG. 9A is a plan view of the pixel 12, and FIG. 9B is a cross-sectional view taken along the line F-F' of FIG. 9A. In FIG. 9A, for simplicity, illustration of the capacitance addition transistor M3 is omitted. Further, in FIG. 9A, for simplicity, each region is illustrated as a rectangular shape, but this does not represent an actual shape of each portion, but indicates that at least each portion is disposed in this region.

As illustrated in FIG. 9A, the basic planar layout of the pixel 12 in the photoelectric conversion device according to the present embodiment is similar to that of the photoelectric conversion device according to the second embodiment. That is, the n-type semiconductor region 150 and the n-type semiconductor region 178 are adjacent to each other with the element isolation region 128 interposed therebetween. The n-type semiconductor region 178 and the n-type semiconductor region 158 are adjacent to each other with the element isolation region 128 interposed therebetween. However, in the present embodiment, the relationship between the element isolation structure 128A isolating the n-type semiconductor regions 150 and 178 and the element isolation structure 128H isolating the n-type semiconductor regions 178 and 158 is different from that in the second embodiment.

That is, in the present embodiment, as illustrated in FIG. 9B, the depth of the element isolation structure 128A provided between the n-type semiconductor regions 150 and 178 is different from the depth of the element isolation structure 128H provided between the n-type semiconductor regions 150 and 178. Generally, in the element isolation insulator structure having the same width, the deeper the depth, the higher the potential barrier to electrons.

The isolation width between the n-type semiconductor regions 150 and 178 by the element isolation structure 128A need not necessarily be larger than the isolation width between the n-type semiconductor regions 178 and 158 by the element isolation structure 128H as in the case of the second embodiment. It is sufficient that the potential barrier for electrons between the n-type semiconductor regions 150 and 178 is higher than the potential barrier for electrons between the n-type semiconductor regions 178 and 158, as a result of configuring the element isolation structures 128A and 128H in this manner. As long as this condition is satisfied, the isolation width between the n-type semiconductor regions 150 and 178 by the element isolation structure 128A may be equal to or less than the isolation width between the n-type semiconductor regions 178 and 158 by the element isolation structure 128H.

By configuring the photoelectric conversion device in this manner, it is possible to suppress leakage of electrons generated in the n-type semiconductor region 178 into the photoelectric conversion unit PD to cause a false signal, thereby improving image quality. When the potential of the output line 16 decreases, as described in the first embodiment, electrons may be generated in the n-type semiconductor region 178 constituting the source of the select transistor M5. Since the element isolation structure 128A is formed of an insulator structure deeper than the element isolation structure 128H, the electrons more easily flow into the n-type semiconductor region 158 beyond the element isolation structure 128H than flow into the n-type semiconductor region 150 beyond the element isolation structure 128A. As a result, leakage of electrons generated in the n-type semiconductor region 178 into the photoelectric conversion unit PD may be suppressed, and false signals may be reduced.

As described above, according to the present embodiment, it is possible to effectively suppress generation of a false signal caused by charges leaking into the photoelectric conversion unit of the pixel, and to acquire a high-quality image.

Seventh Embodiment

A photoelectric conversion device according to a seventh embodiment of the disclosure will be described with reference to FIG. 10A and FIG. 10B. Components similar to those of the photoelectric conversion devices according to the first to sixth embodiments are denoted by the same reference numerals, and descriptions thereof will be omitted or simplified.

The photoelectric conversion device according to the present embodiment is the same as the photoelectric conversion device according to the second embodiment except that the relationship between the element isolation structure isolating the n-type semiconductor regions 150 and 178 and the element isolation structure isolating the n-type semiconductor regions 178 and 158, and the configuration of the n-type semiconductor region 158 are different. In the present embodiment, differences from the photoelectric conversion device according to the second embodiment will be mainly described, and description of the same portions as those of the photoelectric conversion devices according to the first to sixth embodiments will be appropriately omitted.

Figure 10A:
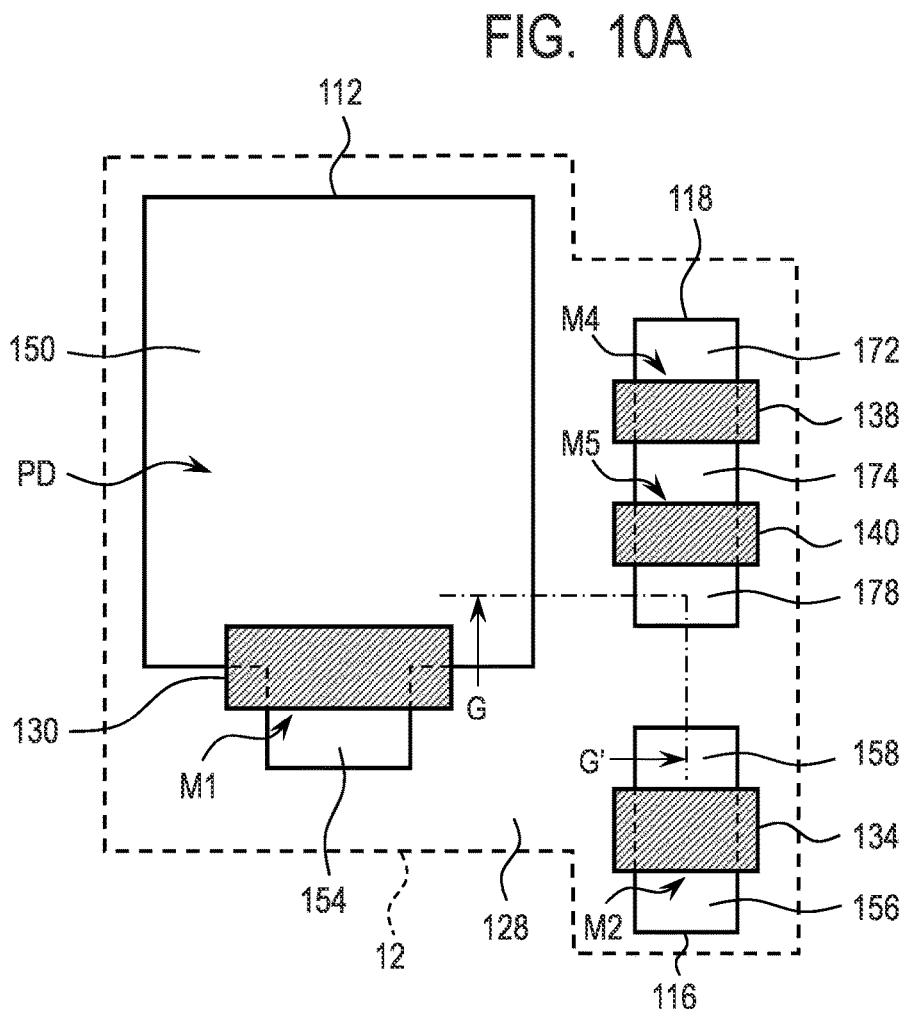
FIG. 10A is a plan view illustrating a structure of a pixel in a photoelectric conversion device according to a seventh embodiment of the disclosure.

FIG. 10A is a plan view illustrating a structure of a pixel in the photoelectric conversion device according to the present embodiment. FIG. 10B is a cross-sectional view illustrating a structure of the pixel in the photoelectric conversion device according to the present embodiment. FIG. 10A is a plan view of the pixel 12, and FIG. 10B is a cross-sectional view taken along the line G-G' of FIG. 10A. In FIG. 10A, for simplicity, illustration of the capacitance addition transistor M3 is omitted. Further, in FIG. 10A, for simplicity, each region is illustrated as a rectangular shape, but this does not represent an actual shape of each portion, but indicates that at least each portion is disposed in this region.

As illustrated in FIG. 10A, the basic planar layout of the pixels 12 in the photoelectric conversion device according to the present embodiment is similar to that of the photoelectric conversion device according to the second embodiment. That is, the n-type semiconductor region 150 and the n-type semiconductor region 178 are adjacent to each other with the element isolation region 128 interposed therebetween. The n-type semiconductor region 178 and the n-type semiconductor region 158 are adjacent to each other with the element isolation region 128 interposed therebetween. However, the present embodiment differs from the second embodiment in the relationship between the element isolation structure isolating the n-type semiconductor regions 150 and 178, the element isolation structure isolating the n-type semiconductor regions 178 and 158, and the configuration of the n-type semiconductor region 158.

Figure 10B:
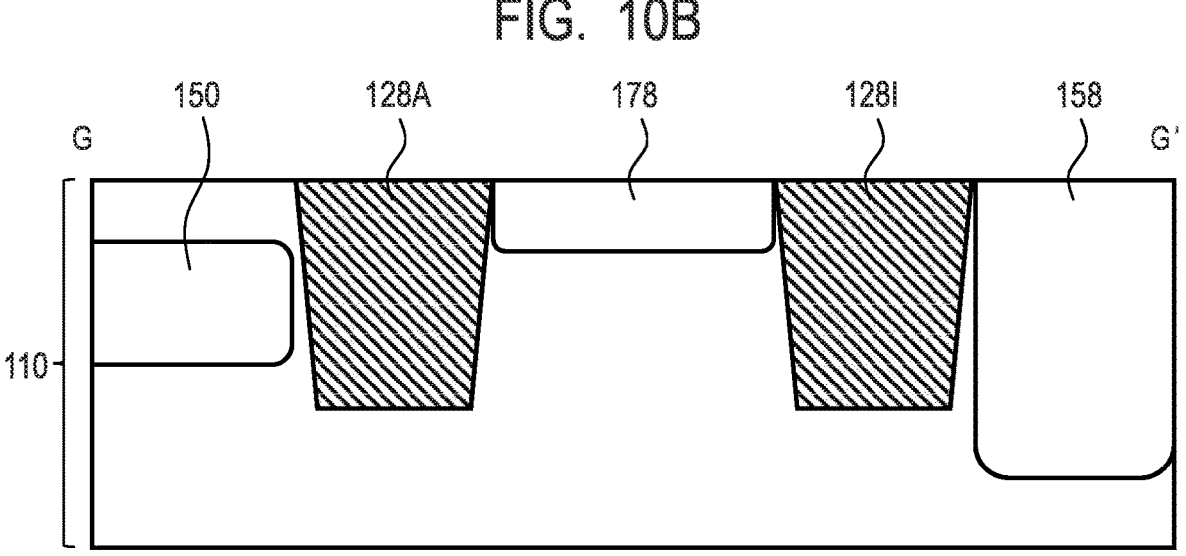
FIG. 10B is a cross-sectional view illustrating a structure of the pixel in the photoelectric conversion device according to the seventh embodiment of the disclosure.

That is, in the present embodiment, as illustrated in FIG. 10B, the n-type semiconductor region 158 is provided deeper in the semiconductor substrate 110 than the n-type semiconductor region 150 constituting the charge accumulation region of the photoelectric conversion unit PD. By configuring the n-type semiconductor region 158 in this manner, a potential barrier for electrons between the n-type semiconductor regions 150 and 178 is higher than a potential barrier for electrons between the n-type semiconductor regions 178 and 158.

The isolation width between the n-type semiconductor regions 150 and 178 by the element isolation structure 128A does not necessarily need to be larger than the isolation width between the n-type semiconductor regions 178 and 158 by the element isolation structure 128I as in the case of the second embodiment. It is sufficient that the potential barrier for electrons between the n-type semiconductor regions 150 and 178 is higher than the potential barrier for electrons between the n-type semiconductor regions 178 and 158, as a result of configuring the n-type semiconductor region 158 in this manner. As long as this condition is satisfied, the isolation width between the n-type semiconductor regions 150 and 178 by the element isolation structure 128A may be equal to or less than the isolation width between the n-type semiconductor regions 178 and 158 by the element isolation structure 128I.

By configuring the photoelectric conversion device in this manner, it is possible to suppress leakage of electrons generated in the n-type semiconductor region 178 into the photoelectric conversion unit PD to cause a false signal, thereby improving image quality. When the potential of the output line 16 decreases, as described in the first embodiment, electrons may be generated in the n-type semiconductor region 178 constituting the source of the select transistor M5. By providing the n-type semiconductor region 158 deeper in the semiconductor substrate 110 than the n-type semiconductor region 150, the electrons are more easily flow into the n-type semiconductor region 158 beyond the element isolation structure 128I than flow into the n-type semiconductor region 150 beyond the element isolation structure 128A. As a result, leakage of electrons generated in the n-type semiconductor region 178 into the photoelectric conversion unit PD may be suppressed, and false signals may be reduced.

As described above, according to the present embodiment, it is possible to effectively suppress generation of a false signal caused by charges leaking into the photoelectric conversion unit of the pixel, and to acquire a high-quality image.

Eighth Embodiment

Figure 11:
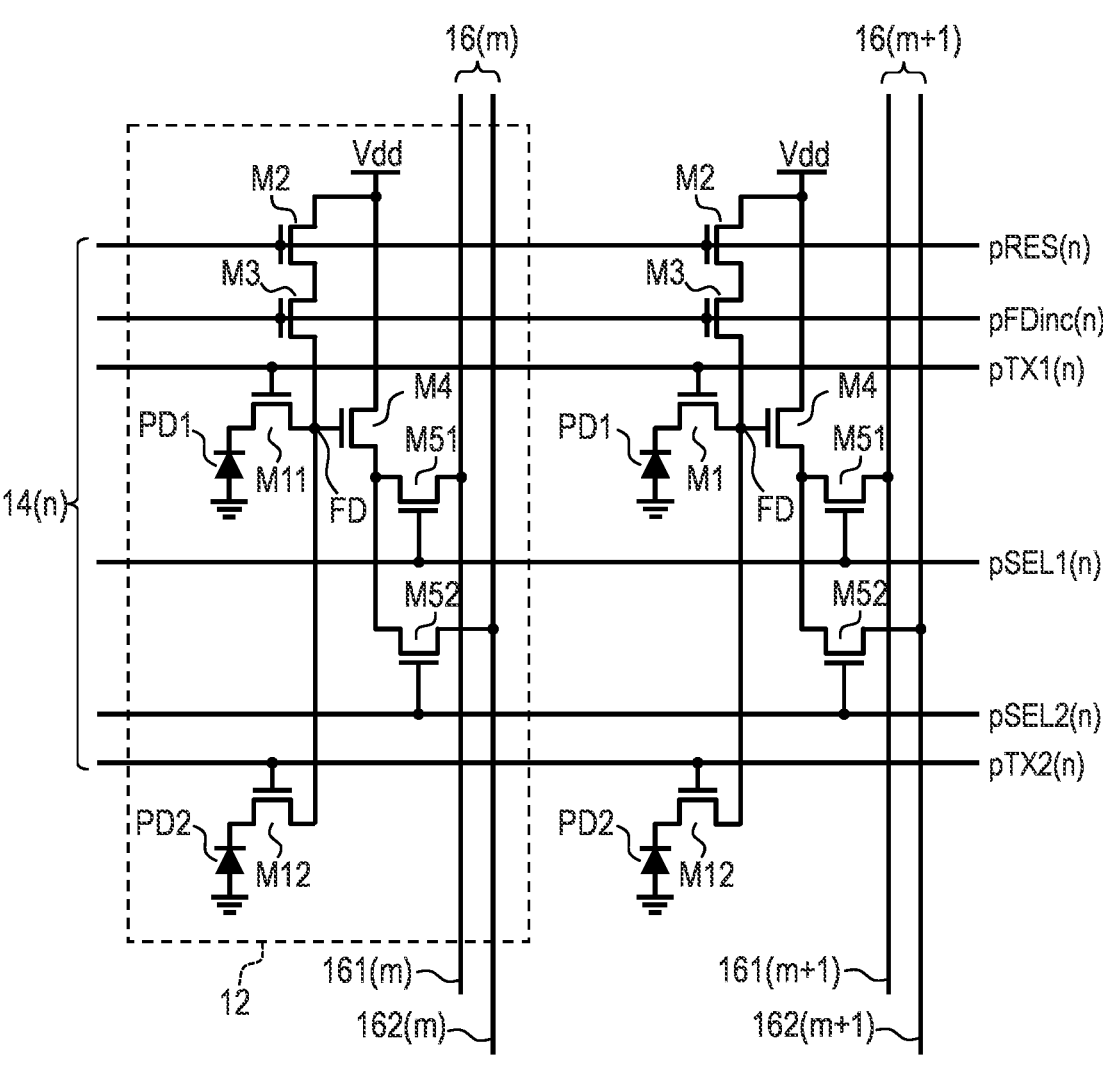
FIG. 11 is an equivalent circuit diagram illustrating a configuration example of a pixel in a photoelectric conversion device according to an eighth embodiment of the disclosure.
Figure 12:
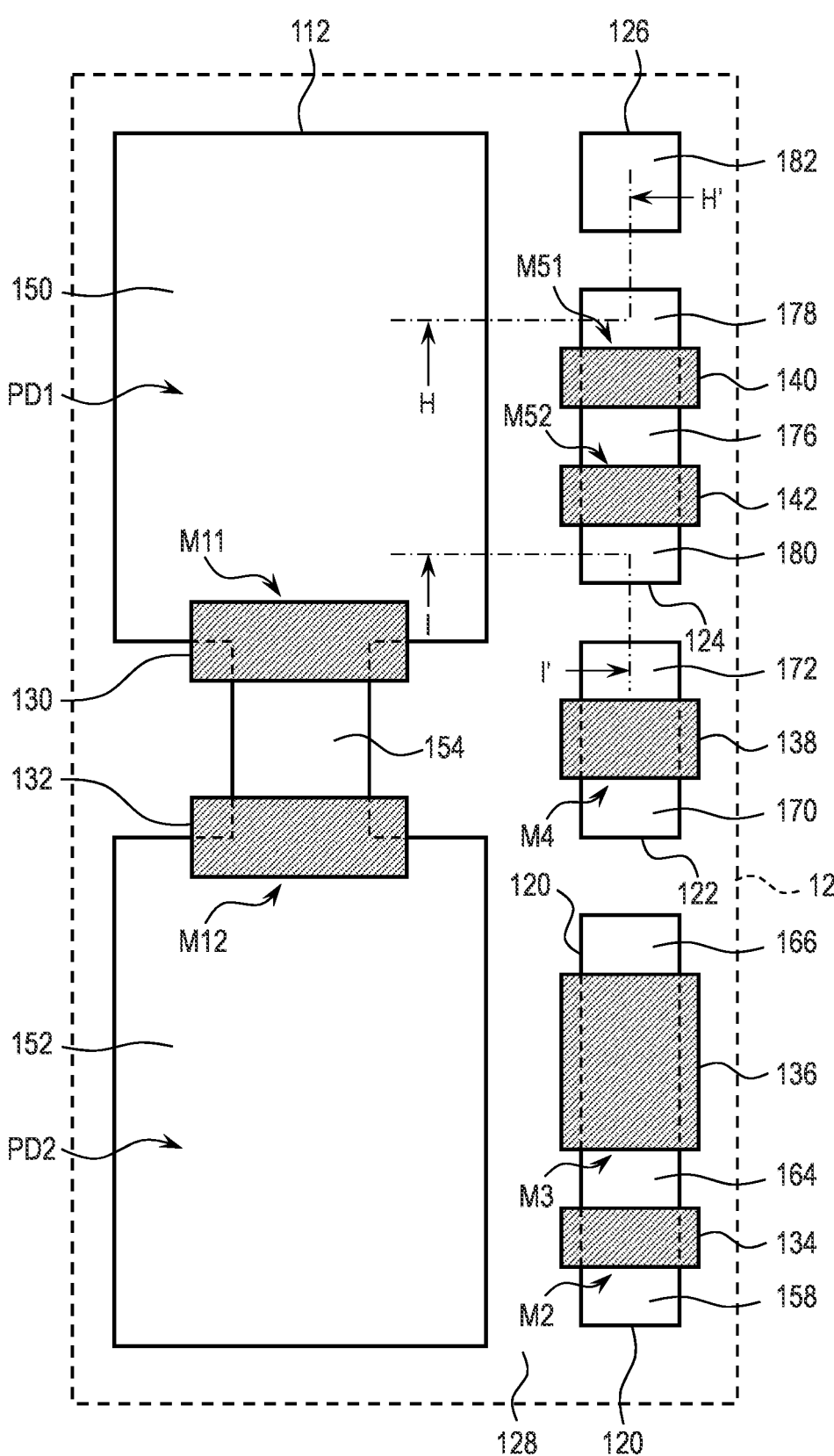
FIG. 12 is a plan view illustrating a structure of the pixel in the photoelectric conversion device according to the eighth embodiment of the disclosure.
Figure 13A:
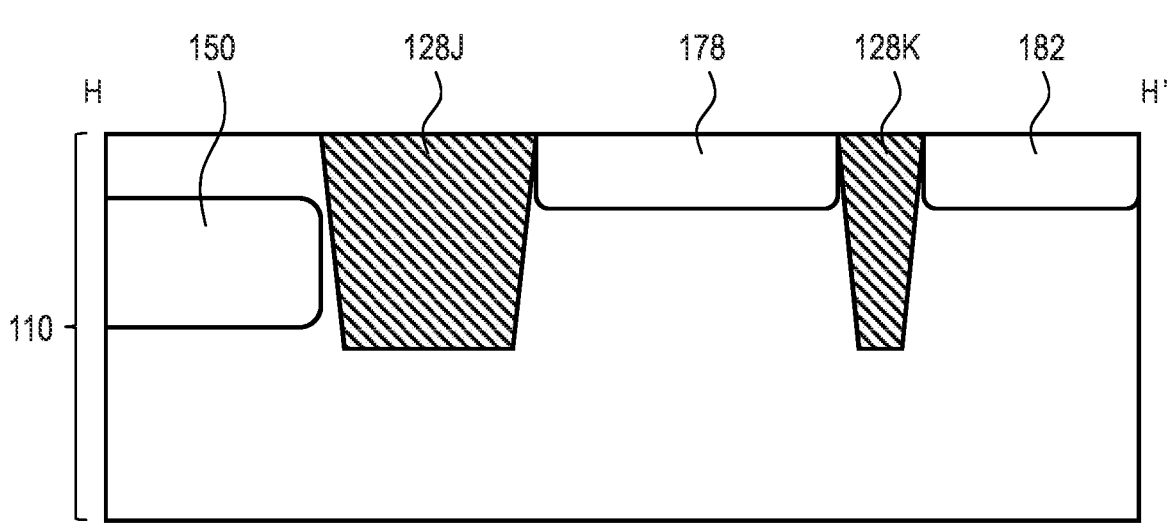
FIG. 13A and FIG. 13B are cross-sectional views illustrating a structure of the pixel in the photoelectric conversion device according to the eighth embodiment of the disclosure.
Figure 13B:
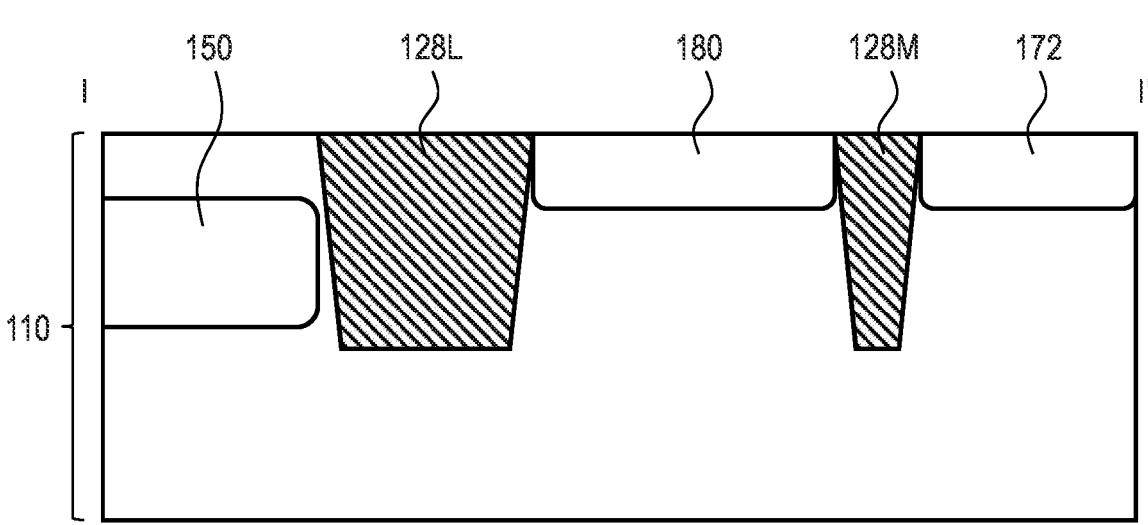

A photoelectric conversion device according to an eighth embodiment of the disclosure will be described with reference to FIG. 11 to FIG. 13B. Components similar to those of the photoelectric conversion devices according to the first to seventh embodiments are denoted by the same reference numerals, and descriptions thereof will be omitted or simplified. FIG. 11 is an equivalent circuit diagram illustrating a configuration example of a pixel in the photoelectric conversion device according to the present embodiment. FIG. 12 is a plan view illustrating a structure of the pixel in the photoelectric conversion device according to the present embodiment. FIG. 13A and FIG. 13B are cross-sectional views illustrating the structure of the pixel in the photoelectric conversion device according to the present embodiment.

The photoelectric conversion device according to the present embodiment is the same as the photoelectric conversion devices according to the first to seventh embodiments except that the configuration of the pixel 12 is different. In the present embodiment, differences from the photoelectric conversion device according to the first embodiment will be mainly described, and description of the same portions as those of the photoelectric conversion devices according to the first to seventh embodiments will be appropriately omitted.

A configuration example of the pixel 12 in the photoelectric conversion device according to the present embodiment will be described with reference to FIG. 11. FIG. 11 illustrates two pixels 12 arranged in a blocks of 1 row (n-th row)×2 columns (m-th column to (m+1)-th column) among the plurality of pixels 12 constituting the pixel region 10. In part of the reference numerals illustrated in FIG. 11, reference numerals indicating row numbers or column numbers are denoted by parentheses.

Each of the pixels 12 may include photoelectric conversion units PD1 and PD2, transfer transistors M11 and M12, a reset transistor M2, an amplifier transistor M4, and select transistors M51 and M52. As illustrated in FIG. 11, each of the pixels 12 may further include a capacitance addition transistor M3. Here, a pixel configuration including the capacitance addition transistor M3 will be described. The transfer transistors M11 and M12, the reset transistor M2, the capacitance addition transistor M3, the amplifier transistor M4 and the select transistors M51 and M52 may be formed of MOS transistors. Each pixel 12 may include a microlens and a color filter arranged on the optical path until incident light is guided to the photoelectric conversion units PD1 and PD2. The microlens collects incident light to the photoelectric conversion units PD1 and PD2. The color filter selectively transmits light of a predetermined color.

The photoelectric conversion unit PD1 may be, for example, a photodiode whose anode is connected to a ground node and whose cathode is connected to a source of the transfer transistor M11. The photoelectric conversion unit PD2 may be, for example, a photodiode whose anode is connected to the ground node and whose cathode is connected to a source of the transfer transistor M12. A drain of the transfer transistor M11 and a drain of the transfer transistor M12 are connected to a source of the capacitance addition transistor M3 and a gate of the amplifier transistor M4. The connection node of the drains of the transfer transistors M11 and M12, the source of the capacitance addition transistor M3, and the gate of the amplifier transistor M4 is a so-called floating diffusion FD. The capacitance component (floating diffusion capacitance) connected to the floating diffusion FD functions as a charge holding portion.

A drain of the capacitance addition transistor M3 is connected to a source of the reset transistor M2. In the case of the pixel configuration that does not include the capacitance addition transistor M3, the source of the reset transistor M2 is connected to the floating diffusion FD. A drain of the reset transistor M2 and a drain of the amplifier transistor M4 are connected to a power supply voltage node (voltage: Vdd). A source of the amplifier transistor M4 is connected to a drain of the select transistor M51 and a drain of the select transistor M52. A source of the select transistor M51 is connected to a signal line 161 of the output line 16. A source of the select transistor M52 is connected to a signal line 162 of the output line 16.

It may be also considered that the pixel 12 includes a pixel including the photoelectric conversion unit PD1 and a pixel including the photoelectric conversion unit PD2 that share one floating diffusion FD. The number of photoelectric conversion units PD included in the pixel 12 is not limited to two, and may be three or more. In this case, the number of transfer transistors M1 corresponding to the number of photoelectric conversion units PD may be provided. The number of select transistors M5 included in the pixel 12 is not limited to two, and may be three or more. In this case, the output lines 16 of each column may include a number of signal lines corresponding to the number of select transistors M5.

In the case of the pixel configuration of FIG. 11, the control line 14 of each row includes six signal lines including a signal line connected to a gate of the transfer transistor M11, a signal line connected to a gate of the transfer transistor M12, a signal line connected to a gate of the capacitance addition transistor, a signal line connected to a gate of the reset transistor M2, a signal line connected to a gate of the select transistor M51, and a signal line connected to a gate of the select transistor M52. A control signal pTX1 is supplied from the vertical scanning circuit 20 to the signal line connected to the gate of the transfer transistor M11. A control signal pTX2 is supplied from the vertical scanning circuit 20 to the signal line connected to the gate of the transfer transistor M12. A control signal pRES is supplied from the vertical scanning circuit 20 to the signal line connected to the gate of the reset transistor M2. A control signal pFDinc is supplied from the vertical scanning circuit 20 to the signal line connected to the gate of the capacitance addition transistor M3. A control signal pSEL1 is supplied from the vertical scanning circuit 20 to the signal line connected to the gate of the select transistor M51. A control signal pSEL2 is supplied from the vertical scanning circuit 20 to the signal line connected to the gate of the select transistor M52. When each transistor is formed of an n-channel MOS transistor, when a high-level control signal is supplied from the vertical scanning circuit 20, the corresponding transistor is turned on. When a low-level control signal is supplied from the vertical scanning circuit 20, the corresponding transistor is turned off.

Next, a specific structure of the pixel 12 in the photoelectric conversion device according to the present embodiment will be described with reference to FIG. 12 to FIG. 13B. FIG. 12 is a plan view of the pixel 12, FIG. 13A is a cross-sectional view taken along a line H-H' of FIG. 12, and FIG. 13B is a cross-sectional view taken along a line I-I' of FIG. 12. In FIG. 12, for simplicity, each region is illustrated as a rectangular shape, but this does not represent an actual shape of each portion, but indicates that at least each portion is disposed in this region.

FIG. 12 illustrates an example of a planar layout of one pixel 12. Active regions 112, 120, 122, 124 and 126 are defined in a region of a semiconductor substrate 110 where the pixel 12 is arranged. A region between the active regions 112, 120, 122, 124 and 126 is an element isolation region 128 for electrically isolating the active regions 112, 120, 122, 124 and 126 by an insulator structure such as STI or p-n junction isolation. A gate electrode 130 of the transfer transistor M11, a gate electrode 132 of the transfer transistor M12, a gate electrode 134 of the reset transistor M2, and a gate electrode 136 of the capacitance addition transistor M3 are provided over the semiconductor substrate 110. A gate electrode 138 of the amplifier transistor M4, a gate electrode 140 of the select transistor M51, and a gate electrode 142 of the select transistor M52 are provided over the semiconductor substrate 110.

In the active region 112, among the components of the pixel 12, the photoelectric conversion units PD1 and PD2, the transfer transistors M11 and M12, and a part of the floating diffusion FD are provided. In the plan view, each of the gate electrodes 130 and 132 is disposed across the active region 112. In the active region 112, an n-type semiconductor region 154 forming the part of the floating diffusion FD is provided in a portion between the gate electrode 130 and the gate electrode 132. In the active region 112, an n-type semiconductor region 150 forming a charge accumulation region of the photoelectric conversion unit PD1 is provided in a portion adjacent to the n-type semiconductor region 154 via a channel region under the gate electrode 130. In the active region 112, an n-type semiconductor region 152 forming a charge accumulation region of the photoelectric conversion unit PD2 is provided in a portion adjacent to the n-type semiconductor region 154 via a channel region under the gate electrode 132.

In the active region 120, among the components of the pixel 12, the reset transistor M2, the capacitance addition transistor M3, and the other part of the floating diffusion FD are provided. In the plan view, each of the gate electrodes 134, 136 is disposed across the active region 120. In the active region 120, an n-type semiconductor region 164 forming the source of the reset transistor M2 and the drain of the capacitance addition transistor M3 is provided in a portion between the gate electrode 134 and the gate electrode 136. An n-type semiconductor region 158 forming the drain of a reset transistor is provided in a portion of the active region 120 adjacent to the n-type semiconductor region 164 via a channel region under the gate electrode 134. An n-type semiconductor region 166 forming the source of the capacitance addition transistor M3 and the other part of the floating diffusion FD is provided in a portion of the active region 120 adjacent to the n-type semiconductor region 164 via a channel region under the gate electrode 136. The n-type semiconductor region 166 is electrically connected to the n-type semiconductor region 154 and the gate electrode 138 via an interconnection (not illustrated). The connection node constitutes the floating diffusion FD as a whole.

In the active region 122, an amplifier transistor M4 among the constituent elements of the pixel 12 is provided. In the plan view, the gate electrode 138 is disposed across the active region 120. In the active region 122, an n-type semiconductor region 170 constituting the drain of the amplifier transistor M4 is provided on one side of the gate electrode 138. In the active region 122, an n-type semiconductor region 172 constituting the source of the amplifier transistor M4 is provided on the other side of the gate electrode 138.

A select transistor M51 and a select transistor M52 among the constituent elements of the pixel 12 are provided in the active region 124. In the plan view, each of the gate electrodes 140, 142 is disposed across the active region 124. In the active region 124, an n-type semiconductor region 176 forming the drain of the select transistor M51 and the drain of the select transistor M52 is provided in a portion between the gate electrode 140 and the gate electrode 142. An n-type semiconductor region 178 constituting the source of the select transistor M51 is provided in a portion of the active region 124 adjacent to the n-type semiconductor region 176 via a channel region under the gate electrode 140. An n-type semiconductor region 180 forming the source of the select transistor M52 is provided in a portion of the active region 124 adjacent to the n-type semiconductor region 176 via a channel region under the gate electrode 142.

An n-type semiconductor region 182 is provided in the active region 126.

The active region 126 serves as a charge discharging region for discharging leaked charges (electrons). The n-type semiconductor region 182 may be connected to a node to which a power supply voltage is supplied to actively eliminate leaked charges.

As illustrated in FIG. 12, the n-type semiconductor region 150 and the n-type semiconductor region 178 are adjacent to each other with the element isolation region 128 interposed therebetween. The n-type semiconductor region 178 and the n-type semiconductor region 182 are adjacent to each other with the element isolation region 128 interposed therebetween. As illustrated in FIG. 13A, an element isolation structure 128J made of an insulator structure such as STI is provided in the element isolation region 128 between the n-type semiconductor region 150 and the n-type semiconductor region 178. An element isolation structure 128K made of an insulator structure such as STI is provided in the element isolation region 128 between the n-type semiconductor region 178 and the n-type semiconductor region 182.

As illustrated in FIG. 12, the n-type semiconductor region 150 and the n-type semiconductor region 180 are adjacent to each other with the element isolation region 128 interposed therebetween. The n-type semiconductor region 180 and the n-type semiconductor region 172 are adjacent to each other with the element isolation region 128 interposed therebetween. As illustrated in FIG. 13B, an element isolation structure 128L made of an insulator structure such as STI is provided in an element isolation region 128 between the n-type semiconductor region 150 and the n-type semiconductor region 180. An element isolation structure 128M made of an insulator structure such as STI is provided in the element isolation region 128 between the n-type semiconductor region 180 and the n-type semiconductor region 172.

Here, in the photoelectric conversion device of the present embodiment, the distance between the n-type semiconductor regions 150 and 178 is larger than the distance between the n-type semiconductor regions 178 and 182. In other words, an isolation width between the n-type semiconductor regions 150 and 178 by the element isolation structure 128J is larger than an isolation width between the n-type semiconductor regions 178 and 182 by the element isolation structure 128K. The distance between the n-type semiconductor regions 150 and 180 is larger than the distance between the n-type semiconductor regions 180 and 172. In other words, an isolation width between the n-type semiconductor regions 150 and 180 by the element isolation structure 128L is larger than an isolation width between the n-type semiconductor regions 180 and 172 by the element isolation structure 128M.

By configuring the photoelectric conversion device in this manner, a potential barrier for electrons between the n-type semiconductor regions 150 and 178 is higher than a potential barrier for electrons between the n-type semiconductor regions 178 and 182. A potential barrier for electrons between the n-type semiconductor regions 150 and 180 is higher than a potential barrier for electrons between the n-type semiconductor regions 180 and 172. Thus, the electrons generated in the n-type semiconductor regions 178 and 180 are prevented from leaking into the photoelectric conversion unit PD1 to cause a false signal, and the image quality may be improved.

When the potential of the output line 16 decreases, as described in the first embodiment, electrons may be generated in the n-type semiconductor region 178 constituting the source of the select transistor M51 or the n-type semiconductor region 180 constituting the source of the select transistor M52. When the element isolation structure 128J is made wider than the element isolation structure 128K, electrons generated in the n-type semiconductor region 178 more easily flow into the n-type semiconductor region 182 beyond the element isolation structure 128K than flow into the n-type semiconductor region 150 beyond the element isolation structure 128J. As a result, leakage of electrons generated in the n-type semiconductor region 178 into the photoelectric conversion unit PD1 may be suppressed, and false signals may be reduced. Similarly, when the element isolation structure 128L is made wider than the element isolation structure 128M, electrons generated in the n-type semiconductor region 180 more easily flow into the n-type semiconductor region 172 beyond the element isolation structure 128M than flow into the n-type semiconductor region 150 beyond the element isolation structure 128L. As a result, leakage of electrons generated in the n-type semiconductor region 180 into the photoelectric conversion unit PD1 may be suppressed, and false signals may be reduced.

As described above, according to the present embodiment, it is possible to effectively suppress generation of a false signal caused by charges leaking into the photoelectric conversion unit of the pixel, and to acquire a high-quality image.

In the present embodiment, the element isolation structure 128J and the element isolation structure 128K, and the element isolation structure 128L and the element isolation structure 128M are formed of insulator structures having different separation widths, but any configuration described in other embodiments may be applied to them. Further, a configuration in which at least two of the other embodiments are combined may be applied to these.

Ninth Embodiment

An imaging system according to a ninth embodiment of the disclosure will be described with reference to FIG. 14. FIG. 14 is a block diagram illustrating a schematic configuration of the imaging system according to the present embodiment.

The photoelectric conversion device 100 described in the first to eighth embodiments may be applied to various imaging systems. Examples of applicable imaging systems include digital still cameras, digital camcorders, surveillance cameras, copying machines, facsimiles, mobile phones, on-vehicle cameras, observation satellites, and the like. A camera module including an optical system such as a lens and an imaging device is also included in the imaging system. FIG. 14 is a block diagram of a digital still camera as an example of these.

The imaging system 200 illustrated in FIG. 14 includes an imaging device 201, a lens 202 for forming an optical image of an object on the imaging device 201, an aperture 204 for varying the amount of light passing through the lens 202, and a barrier 206 for protecting the lens 202. The lens 202 and the aperture 204 form an optical system that collect light on the imaging device 201. The imaging device 201 is the photoelectric conversion device 100 described in any of the first to eighth embodiments, and converts an optical image formed by the lens 202 into image data.

The imaging system 200 also includes a signal processing unit 208 that processes an output signal output from the imaging device 201. The signal processing unit 208 generates image data from a digital signal output from the imaging device 201. The signal processing unit 208 performs various corrections and compressions as necessary and outputs the processed image data. The imaging device 201 may include an AD conversion unit that generates a digital signal to be processed by the signal processing unit 208. The AD conversion unit may be formed on a semiconductor layer (semiconductor substrate) in which the photoelectric conversion unit of the imaging device 201 is formed, or may be formed on a semiconductor substrate different from the semiconductor layer in which the photoelectric conversion unit of the imaging device 201 is formed. The signal processing unit 208 may be formed on the same semiconductor substrate as the imaging device 201.

The imaging system 200 further includes a memory unit 210 for temporarily storing image data, and an external interface unit (external I/F unit) 212 for communicating with an external computer or the like. Further, the imaging system 200 includes a storage medium 214 such as a semiconductor memory for storing or reading out the imaging data, and a storage medium control interface unit (storage medium control I/F unit) 216 for storing or reading out the imaging data on or from the storage medium 214. The storage medium 214 may be built in the imaging system 200, or may be detachable.

The imaging system 200 further includes a general control/operation unit 218 that controls various calculations and operations of the entire digital still camera, and a timing generation unit 220 that outputs various timing signals to the imaging device 201 and the signal processing unit 208. Here, the timing signal or the like may be input from the outside, and the imaging system 200 may include at least the imaging device 201 and the signal processing unit 208 that processes an output signal output from the imaging device 201.

The imaging device 201 outputs the imaging signal to the signal processing unit 208. The signal processing unit 208 performs predetermined signal processing on the imaging signal output from the imaging device 201, and outputs image data. The signal processing unit 208 generates an image using the imaging signal.

As described above, according to the present embodiment, it is possible to realize a high performance imaging system to which the photoelectric conversion device 100 according to the first to eighth embodiments is applied.

Tenth Embodiment

Figure 15A:
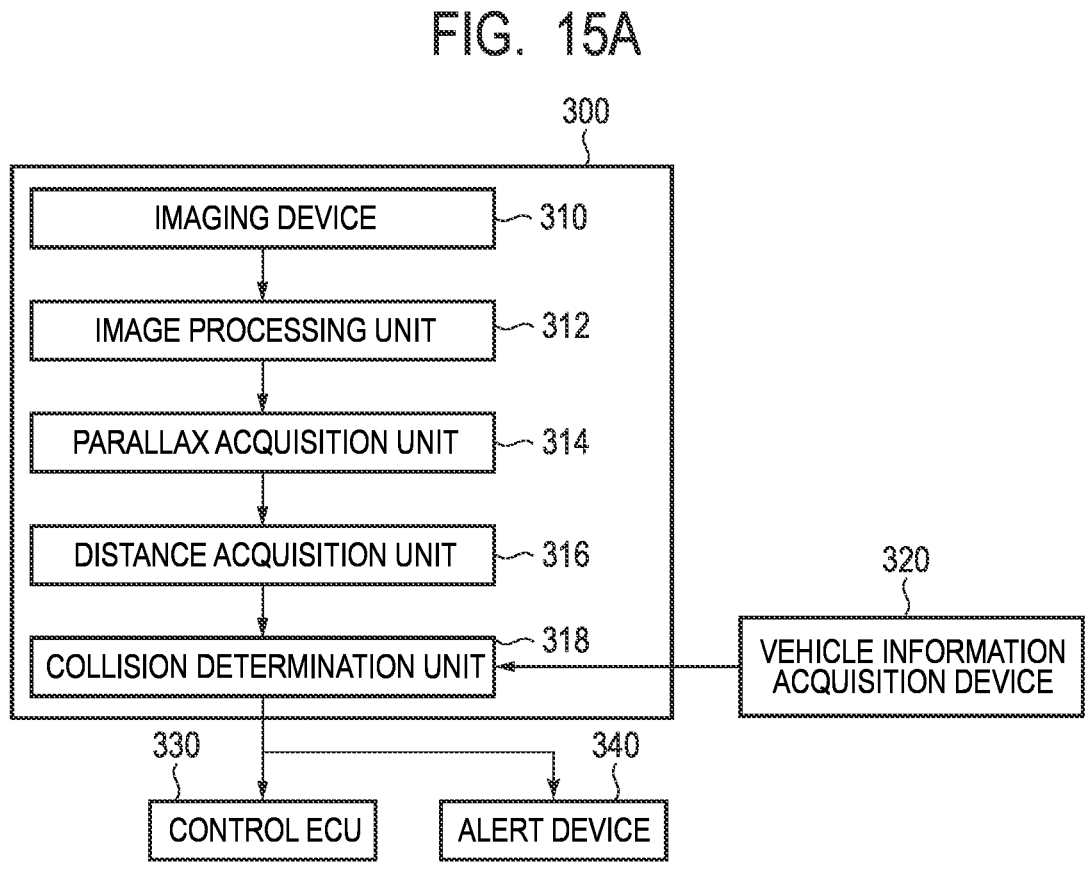
FIG. 15A is a diagram illustrating a configuration example of an imaging system according to a tenth embodiment of the disclosure.
Figure 15B:
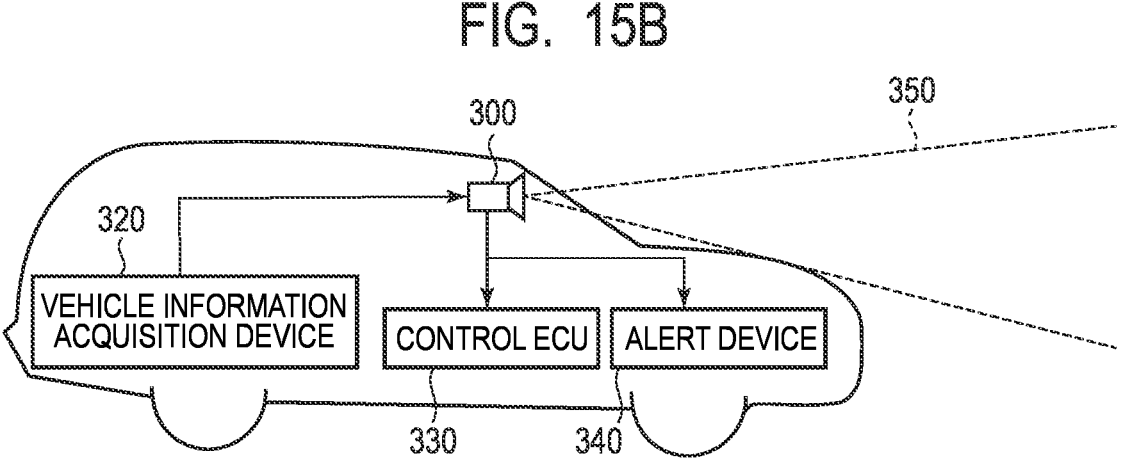
FIG. 15B is a diagram illustrating a configuration example of a movable object according to the tenth embodiment of the disclosure.

An imaging system and a movable object according to a tenth embodiment of the disclosure will be described with reference to FIG. 15A and FIG. 15B. FIG. 15A is a diagram illustrating a configuration of an imaging system according to the present embodiment. FIG. 15B is a diagram illustrating a configuration of a movable object according to the present embodiment.

FIG. 15A illustrates an example of an imaging system relating to an on-vehicle camera. The imaging system 300 includes an imaging device 310. The imaging device 310 is the photoelectric conversion device 100 described in any one of the first to eighth embodiments. The imaging system 300 includes an image processing unit 312 that performs image processing on a plurality of image data acquired by the imaging device 310, and a parallax acquisition unit 314 that calculates parallax (phase difference of parallax images) from the plurality of image data acquired by the imaging device 310. The imaging system 300 includes a distance acquisition unit 316 that calculates a distance to an object based on the calculated parallax, and a collision determination unit 318 that determines whether or not there is a possibility of collision based on the calculated distance. Here, the parallax acquisition unit 314 and the distance acquisition unit 316 are examples of a distance information acquisition unit that acquires distance information to the object. That is, the distance information may be information on a parallax, a defocus amount, a distance to the object, and the like. The collision determination unit 318 may determine the collision possibility using any of these pieces of distance information. The distance information acquisition unit may be implemented by dedicated hardware or software modules. Further, it may be implemented by FPGA (Field Programmable Gate Array), ASIC (Application Specific Integrated circuit), or the like, or may be implemented by a combination of these.

The imaging system 300 is connected to a vehicle information acquisition device 320, and may acquire vehicle information such as a vehicle speed, a yaw rate, and a steering angle. Further, the imaging system 300 is connected to a control ECU 330 which is a control device that outputs a control signal for generating a braking force to the vehicle based on the determination result of the collision determination unit 318. The imaging system 300 is also connected to an alert device 340 that issues an alert to the driver based on the determination result of the collision determination unit 318. For example, when the collision possibility is high as the determination result of the collision determination unit 318, the control ECU 330 performs vehicle control to avoid collision and reduce damage by braking, returning an accelerator, suppressing engine output, or the like. The alert device 340 alerts a user by sounding an alarm such as a sound, displaying alert information on a screen of a car navigation system or the like, or giving vibration to a seat belt or a steering wheel.

In the present embodiment, the imaging system 300 images the periphery of the vehicle, for example, the front or the rear. FIG. 15B illustrates an imaging system in the case of imaging an image in front of a vehicle (an imaging range 350). The vehicle information acquisition device 320 sends an instruction to the imaging system 300 or the imaging device 310. With such a configuration, the accuracy of distance measurement may be further improved.

In the above description, an example has been described in which control is performed so as not to collide with other vehicles, but the disclosure is also applicable to control of automatic driving following other vehicles, control of automatic driving so as not to go out of a lane, and the like. Further, the imaging system is not limited to a vehicle such as a host vehicle, and may be applied to, for example, a movable object (moving device) such as a ship, an aircraft, or an industrial robot. In addition, the disclosure may be applied not only to a mobile object but also to a wide variety of equipment such as ITS (Intelligent Transport Systems).

Eleventh Embodiment

Figure 16:
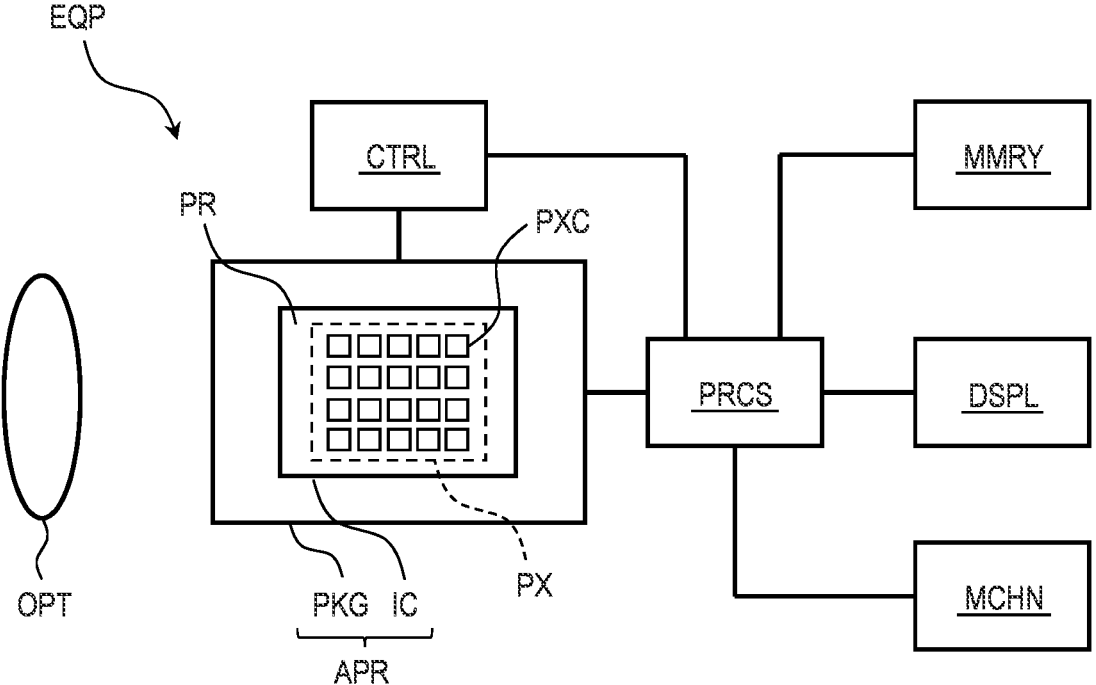
FIG. 16 is a block diagram illustrating a schematic configuration of equipment according to an eleventh embodiment of the disclosure.

Equipment according to an eleventh embodiment of the disclosure will be described with reference to FIG. 16. FIG. 16 is a block diagram illustrating a schematic configuration of equipment according to the present embodiment.

FIG. 16 is a schematic diagram illustrating equipment EQP including the photoelectric conversion device APR. The photoelectric conversion device APR has the function of the photoelectric conversion device 100 of any one of the first to eighth embodiments. All or a part of the photoelectric conversion device APR is a semiconductor device IC. The photoelectric conversion device APR of this example may be used, for example, as an image sensor, an AF (Auto Focus) sensor, a photometry sensor, or a distance measurement sensor. The semiconductor device IC includes a pixel area PX in which pixel circuits PXC including photoelectric conversion units are arranged in a matrix. The semiconductor device IC may include a peripheral area PR around the pixel area PX. Circuits other than the pixel circuits may be arranged in the peripheral area PR.

The photoelectric conversion device APR may have a structure (chip stacked structure) in which a first semiconductor chip provided with a plurality of photoelectric conversion units and a second semiconductor chip provided with peripheral circuits are stacked. Each peripheral circuit in the second semiconductor chip may be a column circuit corresponding to a pixel column of the first semiconductor chip. The peripheral circuits in the second semiconductor chip may be matrix circuits corresponding to the pixels or the pixel blocks of the first semiconductor chip. As a connection between the first semiconductor chip and the second semiconductor chip, a through electrode TSV (Through Silicon Via), an inter-chip interconnection by direct bonding of a conductor such as copper, a connection by micro bumps between chips, a connection by wire bonding, or the like may be adopted.

In addition to the semiconductor device IC, the photoelectric conversion device APR may include a package PKG that accommodates the semiconductor device IC. The package PKG may include a base body to which the semiconductor device IC is fixed, a lid body made of glass or the like facing the semiconductor device IC, and a connection member such as a bonding wire or a bump that connects a terminal provided on the base body to a terminal provided on the semiconductor device IC.

The equipment EQP may further comprise at least one of an optical device OPT, a control device CTRL, a processing device PRCS, a display device DSPL, a storage device MMRY, and a mechanical device MCHN. The optical device OPT corresponds to the photoelectric conversion device APR as a photoelectric conversion device, and is, for example, a lens, a shutter, or a mirror. The control device CTRL controls the photoelectric conversion device APR, and is, for example, a semiconductor device such as an ASIC. The processing device PRCS processes a signal output from the photoelectric conversion device APR, and constitutes an AFE (analog front end) or a DFE (digital front end). The processing unit PRCS is a semiconductor device such as a central processing unit CPU (Central Processing Unit) or an ASIC. The display device DSPL may be an EL (electroluminescent) display device or a liquid crystal display device which displays information (image) obtained by the photoelectric conversion device APR. The storage device MMRY may be a magnetic device or a semiconductor device that stores information (image) obtained by the photoelectric conversion device APR. The storage device MMRY may be a volatile memory such as an SRAM or a DRAM, or a nonvolatile memory such as a flash memory or a hard disk drive. The mechanical device MCHN may include a movable portion or a propulsion portion such as a motor or an engine. In the equipment EQP, a signal output from the photoelectric conversion device APR may be displayed on the display device DSPL, and is transmitted to the outside by a communication device (not illustrated) included in the equipment EQP. Therefore, in one embodiment, the equipment EQP further includes a storage device MMRY and a processing device PRCS separately from the storage circuit unit and the arithmetic circuit unit included in the photoelectric conversion device APR.

The equipment EQP illustrated in FIG. 16 may be an electronic device such as an information terminal (for example, a smartphone or a wearable terminal) having a photographing function or a camera (for example, an interchangeable lens camera, a compact camera, a video camera, and a surveillance camera). The mechanical device MCHN in the camera may drive components of the optical device OPT for zooming, focusing, and shutter operation. The equipment EQP may be a transportation device (movable object) such as a vehicle, a ship, or an airplane. The equipment EQP may be a medical device such as an endoscope or a CT scanner.

The mechanical device MCHN in the transport device may be used as a mobile device. The equipment EQP as a transport device is suitable for transporting the photoelectric conversion device APR, or for assisting and/or automating operation (manipulation) by an imaging function. The processing device PRCS for assisting and/or automating operation (manipulation) may perform processing for operating the mechanical device MCHN as a mobile device based on information obtained by the photoelectric conversion device APR.

The photoelectric conversion device APR according to the present embodiment may provide the designer, the manufacturer, the seller, the purchaser, and/or the user with high value. Therefore, when the photoelectric conversion device APR is mounted on the equipment EQP, the value of the equipment EQP may be increased. Therefore, in order to increase the value of the equipment EQP, it is advantageous to determine the mounting of the photoelectric conversion device APR of the present embodiment on the equipment EQP when the equipment EQP is manufactured and sold.

MODIFIED EMBODIMENTS

The disclosure is not limited to the above-described embodiments, and various modifications are possible.

For example, an example in which some of the configurations of any of the embodiments are added to other embodiments or an example in which some of the configurations of any of the embodiments are substituted with some of the configurations of the other embodiments is also an embodiment of the disclosure.

The circuit configuration of the pixel 12 illustrated in FIG. 2 and FIG. 11 is an example, and may be appropriately changed. For example, each pixel 12 may include two or more photoelectric conversion elements. In this case, a plurality of photoelectric conversion elements may share one floating diffusion FD. Further, a plurality of photoelectric conversion elements may be pupil-division pixels sharing one microlens so that phase difference may be detected. The capacitance addition transistor M3 is not necessarily connected between the reset transistor M2 and the floating diffusion FD, and may be connected between the floating diffusion FD and the ground node. The pixel 12 does not necessarily have to include the capacitance addition transistor M3.

The planar layouts of the pixel 12 illustrated in the above-described embodiments are merely an example, and may be appropriately changed. The disclosure may be widely applied to a case where at least the semiconductor region constituting the charge accumulation region of the photoelectric conversion unit and the semiconductor region constituting the source of the select transistor are adjacent to each other with the element isolation region interposed therebetween.

The imaging systems described in the ninth and tenth embodiments are examples of imaging systems to which the photoelectric conversion device of the disclosure may be applied, and imaging systems to which the photoelectric conversion device of the disclosure may be applied are not limited to the configurations illustrated in FIG. 14 and FIG. 15A.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2022-101648, filed Jun. 24, 2022, which is hereby incorporated by reference herein in its entirety.

What is claimed is:

1. A photoelectric conversion device comprising:

a pixel provided on a semiconductor substrate and including a photoelectric conversion unit, a floating diffusion to which charge generated in the photoelectric conversion unit is transferred, an amplifier transistor that generates a signal according to a voltage of the floating diffusion, and a select transistor that controls an output of the signal; and an output line to which the signal from the pixel is output, wherein the photoelectric conversion unit includes a first semiconductor region of a first conductivity type for storing charge generated by photoelectric conversion, wherein the select transistor includes a second semiconductor region of the first conductivity type forming a node to which the output line is connected, wherein the pixel further includes a third semiconductor region of the first conductivity type configured to discharge charge, wherein the second semiconductor region is adjacent to the first semiconductor region with a first element isolation structure interposed therebetween, and is adjacent to the third semiconductor region with a second element isolation structure interposed therebetween, and wherein a shortest distance between the first semiconductor region and the second semiconductor region via the first element isolation structure is greater than a shortest distance between the second semiconductor region and the third semiconductor region via the second element isolation structure.

2. The photoelectric conversion device according to claim 1, wherein the third semiconductor region is connected to a node to which a power supply voltage is supplied.

3. The photoelectric conversion device according to claim 2, wherein the third semiconductor region is a main node of the amplifier transistor.

4. The photoelectric conversion device according to claim 2, wherein the pixel further includes a reset transistor configured to reset a voltage of the floating diffusion, and wherein the third semiconductor region is a main node of the reset transistor.

5. The photoelectric conversion device according to claim 1, wherein the first element isolation structure is formed of an insulator structure.

6. The photoelectric conversion device according to claim 5, wherein the second element isolation structure is formed of an insulator structure.

7. The photoelectric conversion device according to claim 6, wherein the insulator structure constituting the first element isolation structure is provided deeper in the semiconductor substrate than the insulator structure constituting the second element isolation structure.

8. The photoelectric conversion device according to claim 5, wherein the second element isolation structure is comprised of a fourth semiconductor region of a second conductivity type different from the first conductivity type.

9. The photoelectric conversion device according to claim 1, wherein the first element isolation structure is comprised of a fifth semiconductor region of a second conductivity type different from the first conductivity type.

10. The photoelectric conversion device according to claim 9, wherein the second element isolation structure is comprised of a sixth semiconductor region of the second conductivity type.

11. The photoelectric conversion device according to claim 10, wherein an impurity concentration of the fifth semiconductor region is higher than an impurity concentration of the sixth semiconductor region.

12. The photoelectric conversion device according to claim 1, wherein the third semiconductor region is formed deeper in the semiconductor substrate than the first semiconductor region.

13. The photoelectric conversion device according to claim 1, wherein the select transistor comprises a plurality of select transistors and the output line comprises a plurality of output lines provided corresponding to the plurality of select transistors, and wherein the third semiconductor region comprises a plurality of third semiconductor regions provided corresponding to the second semiconductor region of each of the plurality of select transistors.

14. The photoelectric conversion device according to claim 1, wherein the pixel comprises a plurality of pixels each connected to the output line.

15. A system comprising:

the photoelectric conversion device according to claim 1; and a signal processing device configured to process a signal output from the photoelectric conversion device.

16. A movable object comprising:

the photoelectric conversion device according to claim 1;

an acquisition unit configured to acquire distance information to an object from a parallax image based on a signal from the photoelectric conversion device; and a control unit configured to control the movable object based on the distance information.

17. Equipment comprising:

the photoelectric conversion device according to claim 1, and at least one of an optical device corresponding to the photoelectric conversion device, a control device configured to control the photoelectric conversion device, a processing device configured to process a signal output from the photoelectric conversion device, a mechanical device that is controlled based on information obtained by the photoelectric conversion device, a display device configured to display information obtained by the photoelectric conversion device, and a storage device configured to store information obtained by the photoelectric conversion device.

18. The photoelectric conversion device according to claim 1, wherein the charge is a first polarity, and wherein a potential barrier for the charge of the first polarity of the first element isolation structure between the first semiconductor region and the second semiconductor region is higher than a potential barrier for the charge of the first polarity of the second element isolation structure between the second semiconductor region and the third semiconductor region.

* * * * *